United States Patent
Ahn et al.

(10) Patent No.: US 11,506,983 B2
(45) Date of Patent: Nov. 22, 2022

(54) METHOD OF DESIGNING MASK LAYOUT BASED ON ERROR PATTERN AND METHOD OF MANUFACTURING MASK

(71) Applicant: Samsung Electronics Co., Ltd., Suwon-si (KR)

(72) Inventors: Hungbae Ahn, Hwaseong-si (KR); Sangoh Park, Hwaseong-si (KR); Seunghune Yang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/185,140

(22) Filed: Feb. 25, 2021

(65) Prior Publication Data

US 2022/0043359 A1 Feb. 10, 2022

(30) Foreign Application Priority Data

Aug. 6, 2020 (KR) .................. 10-2020-0098633

(51) Int. Cl.
*G03F 7/20* (2006.01)
*H01L 27/02* (2006.01)

(52) U.S. Cl.
CPC ...... *G03F 7/70433* (2013.01); *H01L 27/0274* (2013.01)

(58) Field of Classification Search
CPC ...... G03F 7/70433; G03F 7/2004; G03F 1/36; G03F 7/70441; G03F 1/80; G03F 1/76; G03F 7/70625; G03F 1/70; G03F 1/22; G03F 1/72; G03F 7/7065; H01L 27/0274; H01L 27/11575; H01L 27/11568; H01L 27/11573; H01L 27/11582; H01L 21/027; H01L 21/0274; H01L 22/12; G06F 30/398; G06F 30/392
See application file for complete search history.

(56) References Cited

U.S. PATENT DOCUMENTS

| | | | |
|---|---|---|---|
| 8,295,584 B2 | 10/2012 | Sato et al. | |
| 8,392,854 B2 | 3/2013 | Kim et al. | |
| 8,878,273 B2 | 11/2014 | Kim et al. | |
| 9,530,731 B2 | 12/2016 | Fang et al. | |
| 9,679,100 B2 | 6/2017 | Cheng et al. | |
| 9,696,150 B2 | 7/2017 | Matsuoka | |
| 10,170,495 B2 | 1/2019 | Kim et al. | |
| 2017/0053055 A1* | 2/2017 | Cheng | G03F 1/36 |
| 2017/0329888 A1* | 11/2017 | Kim | G03F 1/36 |
| 2020/0064728 A1 | 2/2020 | Misaka et al. | |

FOREIGN PATENT DOCUMENTS

KR 10-1095077 B1 12/2011

* cited by examiner

*Primary Examiner* — Mesfin T Asfaw
(74) *Attorney, Agent, or Firm* — Harness, Dickey & Pierce, P.L.C.

(57) ABSTRACT

A method of manufacturing a mask may include identifying an error pattern of final patterns formed on a substrate, correcting a first target pattern on the basis of the error pattern, fracturing a first mask layout into a plurality of first segments on the basis of the corrected first target pattern, and correcting the first mask layout by biasing a plurality of first target segments corresponding to a first final target among the plurality of segments. The first mask layout may include a first extension pattern, final targets disposed in zigzags, and the first final target corresponding to the error pattern, and each of the plurality of first segments may corresponds to one of the final targets.

20 Claims, 23 Drawing Sheets

METHOD OF DESIGNING MASK LAYOUT BASED ON ERROR PATTERN AND METHOD OF MANUFACTURING MASK

CROSS-REFERENCE TO THE RELATED APPLICATION

This application claims priority from Korean Patent Application No. 10-2020-0098633, filed on Aug. 6, 2020 in the Korean Intellectual Property Office, the disclosure of which is incorporated herein by reference in its entirety.

BACKGROUND

Some example embodiments relate to a method of designing a mask layout and/or a method of manufacturing a mask by using the method.

In a semiconductor process, a photolithography process may be performed for forming a pattern on a semiconductor substrate such as a wafer. By using two line patterns extending in different directions, a final pattern having a contact shape and/or a dot shape may be implemented on the semiconductor substrate.

SUMMARY

Some example embodiments provide a method of manufacturing a mask, which includes a process of correcting a target pattern and a mask layout on the basis of an error pattern.

A method of manufacturing a mask in accordance with some example embodiments may include identifying an error pattern of final patterns corresponding to patterns on a substrate, correcting a first target pattern based on the error pattern, fracturing a first mask layout into a plurality of first segments based on the corrected first target pattern, the first mask layout including (a) a first extension pattern extending in a first horizontal direction, (b) final targets corresponding to the final patterns and arranged in a zigzag fashion, and (c) a first final target corresponding to the error pattern, each of the plurality of first segments corresponding to one of the final targets, and correcting the first mask layout by biasing a plurality of first target segments corresponding to the first final target among the plurality of first segments.

A method of manufacturing a mask in accordance with some example embodiments may include identifying an error pattern of final patterns corresponding to patterns on a substrate, correcting a first target pattern based on the error pattern, fracturing a first mask layout into a plurality of first segments based on the corrected first target pattern, the first mask layout including (A) a first extension pattern extending in a first horizontal direction, (B) final targets corresponding to the final patterns, and (C) a first final target in a lattice structure, the first final target corresponding to the error pattern, each of the plurality of first segments corresponding to one of the final targets, and correcting the first mask layout by biasing a plurality of first target segments corresponding to the first final target among the plurality of first segments.

A method of manufacturing a semiconductor device in accordance with some example embodiments may include identifying an error pattern of final patterns corresponding to patterns on a substrate, correcting a first target pattern based on the error pattern, fracturing a first mask layout into a plurality of first segments based on the corrected first target pattern, the first mask layout including (A) a first extension pattern extending in a first horizontal direction, (B) final targets corresponding to the final patterns, and (C) a first final target disposed in zigzags to correspond to the error pattern, each of the plurality of first segments corresponds to one of the final targets, correcting the first mask layout by biasing a plurality of first target segments corresponding to the first final target among the plurality of first segments, forming a photomask based on the corrected first mask layout, forming a photoresist pattern by using the photomask, and forming a semiconductor pattern on the substrate by using the photoresist pattern.

DETAILED DESCRIPTION OF SOME EXAMPLE EMBODIMENTS

Figure 1:
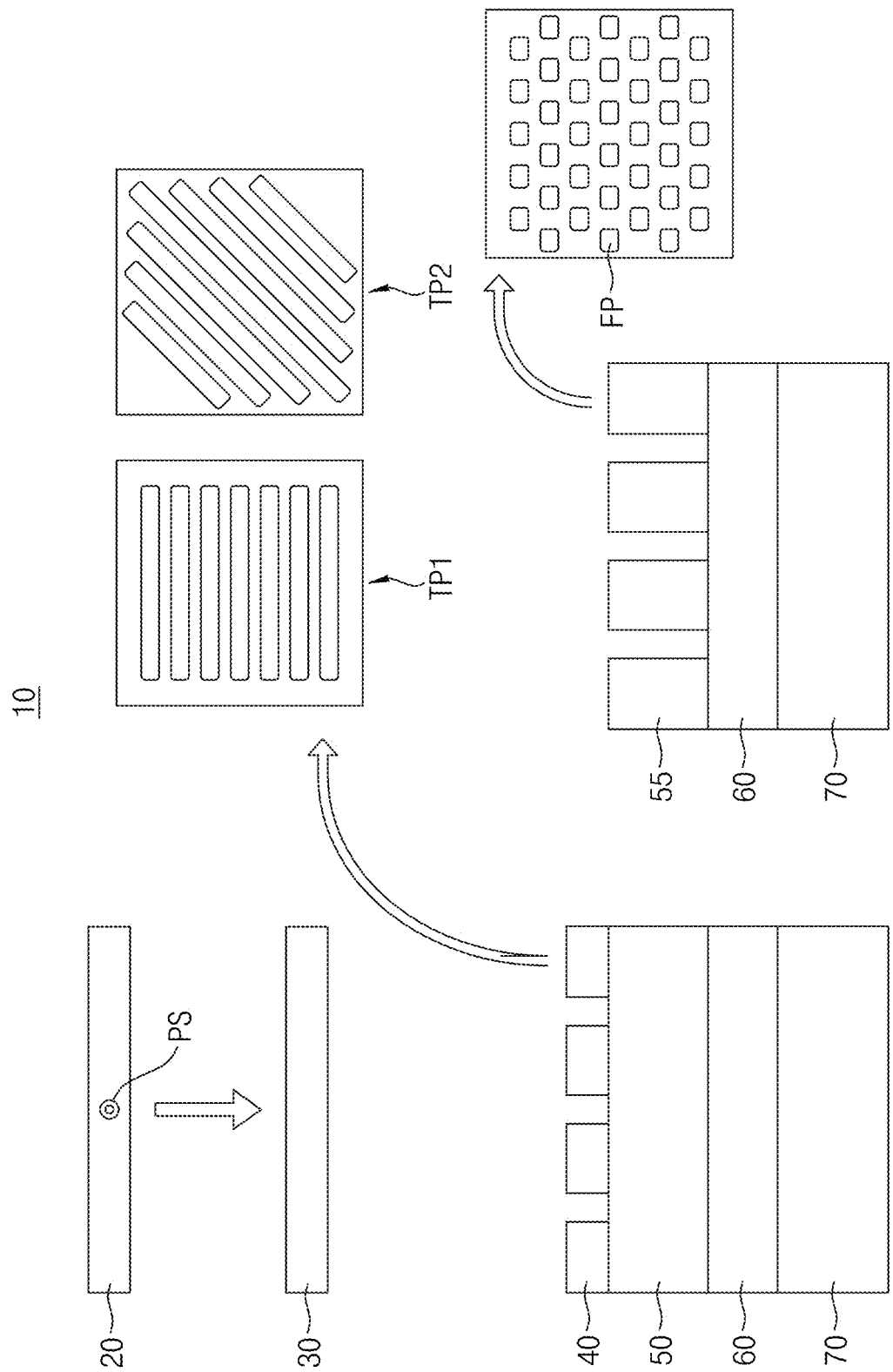
FIG. 1 is a conceptual view illustrating a photolithography system according to some example embodiments of inventive concepts.

FIG. 1 is a conceptual view illustrating a photolithography system 10 according to some example embodiments of inventive concepts.

Referring to FIG. 1, the photolithography system 10 may include a light source 20, a photomask 30, photoresist 40, a hard mask 50, a target layer 60, and a substrate 70. In some example embodiments, the photolithography system 10 may further include a reduction projector may be disposed between the light source 20 and the photomask 30 and/or between the photomask 30 and the photoresist 40.

The light source 20 may emit radiation such as light. The light emitted from the light source 20 may be irradiated onto the photomask 30. For example, in order to adjust a light focus, a lens and/or a mirror may be provided between the light source 20 and the photomask 30. The light source 20 may include an ultraviolet (UV) source 20. The light source 20 may include one point light source PS, but example embodiments are not limited thereto. In some example embodiments, the light source 20 may include a plurality of point light sources PS.

In order to print (implement) a layout of the photomask 30, the photomask 30 may include a plurality of image patterns. The plurality of image patterns may be formed based on a plurality of layout patterns, where the plurality of layout patterns are obtained based on a layout design/optical proximity correction (OPC). The image patterns may be defined based on a transparent region and an opaque region. The transparent region may be formed by etching a metal layer of the photomask 30. The transparent region may transmit, e.g. allow for transmission of, the light emitted from the light source 20. On the other hand, the opaque region may not transmit the emitted light and may block light.

A layout of the photomask 30 may include a plurality of layers. For example, the OPC may be performed to adjust a layout of a single layer. For example, the OPC may be independently performed on each of a plurality of layers. The plurality of layers may be sequentially implemented on the substrate 70 through a semiconductor process, and thus, a semiconductor device may be formed. For example, the semiconductor device may include a plurality of metal layers such as runners and/or vias for implementing a specific circuit.

A layout of the photomask 30 may be implemented on/transferred to the photoresist 40. For example, the layout of the photomask 30 may be transferred onto the photoresist 40 by a lithography process. In some example embodiments, a target pattern may include two layers. For example, a first target pattern TP1 and a second target pattern TP2 may be used, and two photoresists may be used to implement the first target pattern TP1 and the second target pattern TP2. The first target pattern TP1 may intersect with the second target pattern TP2 in a direction such as a diagonal direction, but example embodiments are not limited thereto. For example, in some example embodiments, the first target pattern TP1 may be perpendicular to the second target pattern TP2.

Herein, a mask layout may denote a layout of a pattern formed on the photomask 30. The target pattern may denote a shape which is to be formed on the photoresist 40 on the basis of the mask layout. For example, the target pattern may denote an image which is formed on the photoresist 40 after a lithography process, based on the photomask 30 and a development process. In terms of a characteristic of the lithography process, a shape of the mask layout may partially differ from that of the target pattern, for example because of diffraction effects.

A pattern of the photoresist 40 may be implemented as a final pattern FP on a patterned hard mask 55. For example, the final pattern FP may be implemented by etching the hard mask 50 by using, as an etch mask, each of a photoresist 40 with the first target pattern TP1 implemented therein and a photoresist 40 with the second target pattern TP2 implemented therein. The etching may be with a dry etching process and/or a wet etching process. The final pattern FP may have a hole shape and/or a pillar shape. The hole shape may be circular and/or oval/elliptical. Here, the final pattern FP may denote an image after an etching process and a cleaning process. The final pattern FP may differ from a target pattern on the photoresist 40, based on a process condition including an etched material and a relative position on a wafer.

The target layer 60 may be disposed on the substrate 70, and a pattern of the hard mask 50 may be implemented on the target layer 60 by an etching process. The etching process performed on the target layer 60 may be performed differently from and/or separately from, e.g. after, the etching process of the hard mask 50; however, example embodiments are not limited thereto. Further the etching process of the target layer 60 may be with a dry etching process and/or a wet etching process. For example, a semiconductor pattern may be implemented by etching the target layer 60 by using the pattern of the hard mask 50 as an etch mask.

Figure 2:
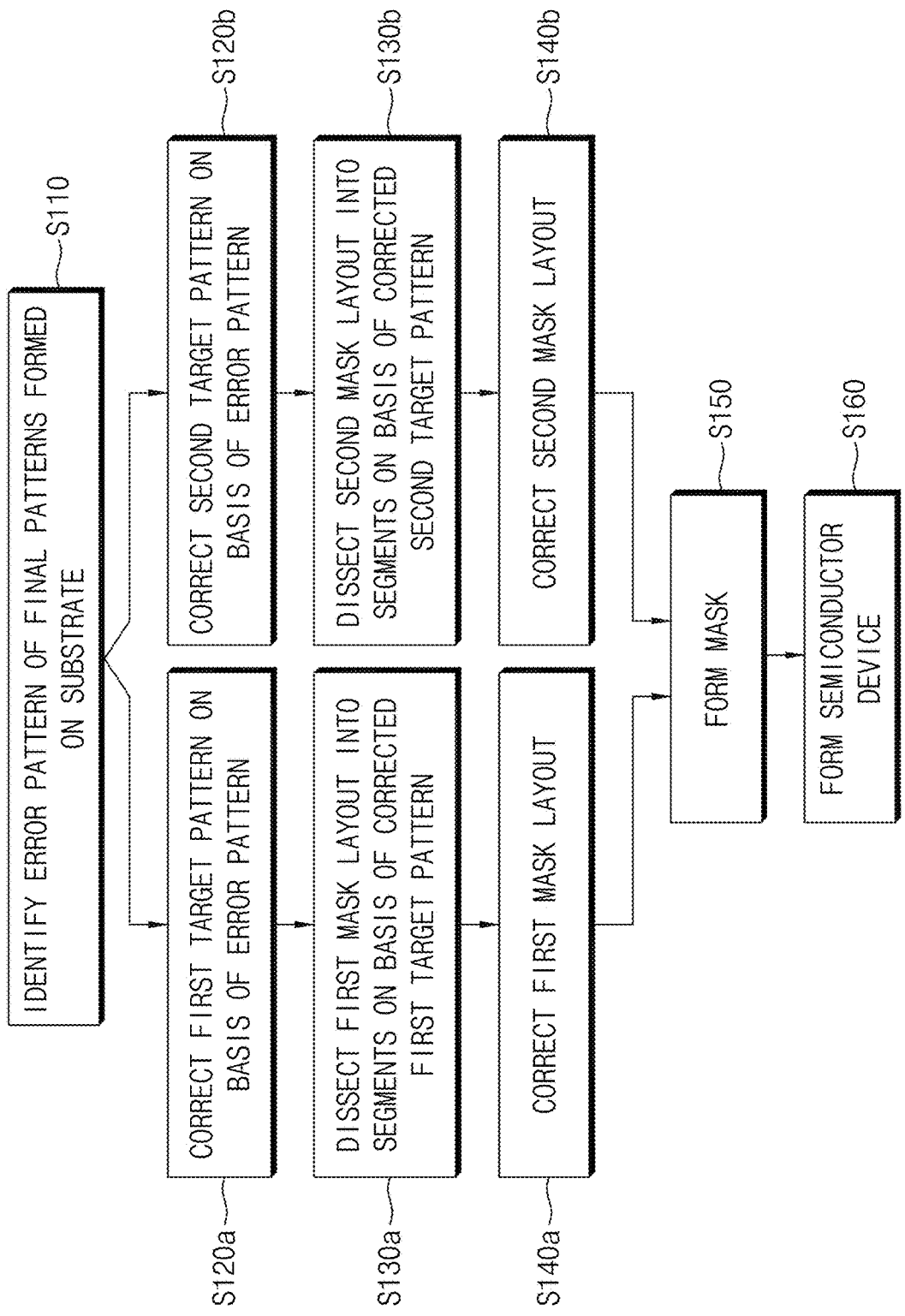
FIG. 2 is a flowchart illustrating a method of manufacturing a semiconductor device, according to some example embodiments of inventive concepts.

FIG. 2 is a flowchart illustrating a method of manufacturing a semiconductor device, according to some example embodiments of inventive concepts.

Referring to FIG. 2, the method of fabricating/manufacturing a semiconductor device, according to some example embodiments may include a process (S110) of identifying an error pattern of final patterns formed/to be formed on a substrate, a process (S120a) of correcting a first target pattern on the basis of the error pattern, a process (S130a) of fracturing and/or dissecting a first mask layout into a plurality of segments on the basis of a corrected first target pattern, a process (S140a) of correcting the first mask layout, a process (S120b) of correcting a second target pattern on the basis of the error pattern, a process (S130b) of fracturing and/or dissecting a second mask layout into a plurality of segments on the basis of a corrected second target pattern, a process (S140b) of correcting the second mask layout, a process (S150) of forming a mask, and a process (S160) of forming a semiconductor device.

Regarding to the process (S110) of identifying the error pattern of the final patterns, each of the final patterns formed on the substrate may be or correspond to a contact pattern, a via pattern, and/or a dot pattern. The contact and/or via pattern may have, for example, a hole shape, and the dot pattern may have a pillar shape.

The process of identifying the error pattern of the final patterns may include a process of simulation such as process simulation, and/or a process of measuring a scanning electron microscope (SEM) image such as a critical dimension SEM (CD-SEM) image. For example, when seen in a plan view, the final pattern may be circular. However, example embodiments are not limited thereto. Herein, the error pattern may denote a pattern having a size, e.g. a critical dimension, which is greater or less than that of a final pattern to be formed, and/or may denote a pattern which is misaligned with the other final patterns.

After the process (S110) of identifying the error pattern, the process (S120a) of correcting the first target pattern may be performed based on the error pattern and the process (S120b) of correcting the second target pattern may be performed based on the error pattern. In some example embodiments, the process (S120a) and the process (S120b) may be performed in parallel, partially in parallel, or selectively. For example, only the processes (S120a, S130a, and S140a) may be performed, and the processes (S120b, S130b, and S140b) may not be performed. Alternatively, a case opposite thereto may be performed, and all of the processes (S120a, S130a, S140a, S120b, S130b, and S140b)

may be performed. In some example embodiments, the processes (S120a, S130a, S140a, S120b, S130b, and S140b) may be sequentially performed.

Figure 3:
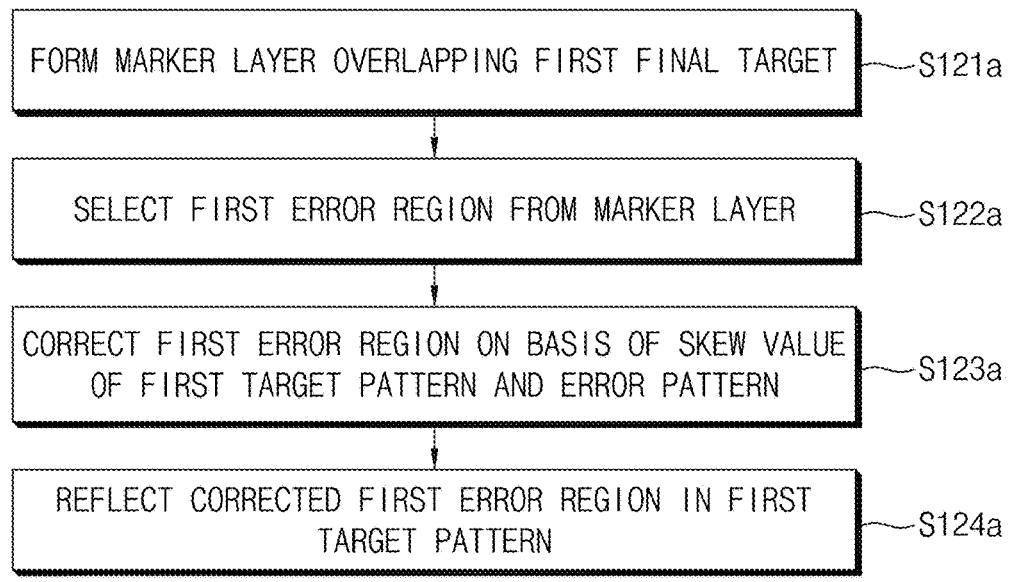
FIG. 3 is a flowchart illustrating a process included in a method of correcting a first target pattern, according to some example embodiments of inventive concepts.
Figure 4:
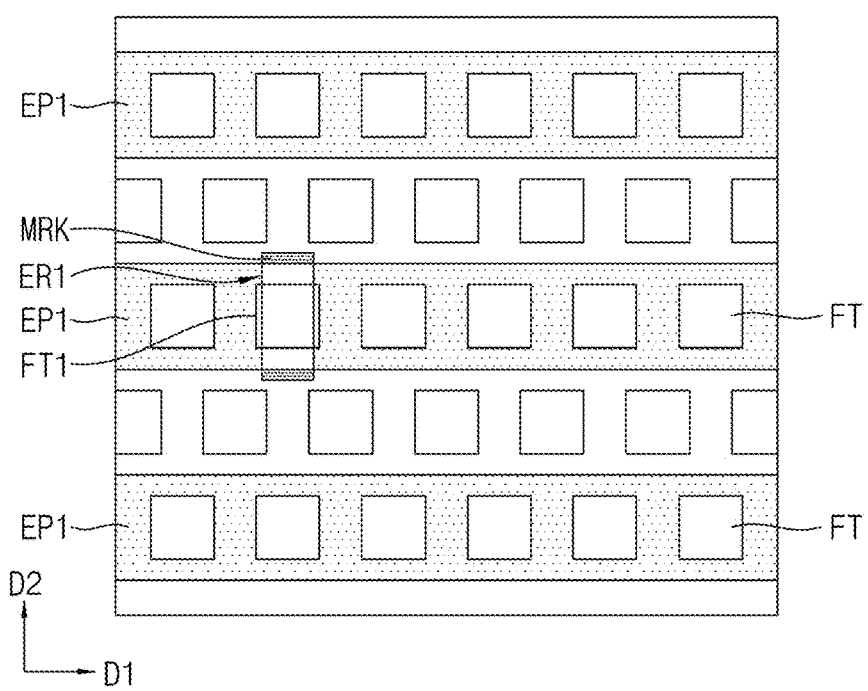
FIGS. 4 and 5 are conceptual views of a method of correcting a first target pattern, according to some example embodiments of inventive concepts.
Figure 5:
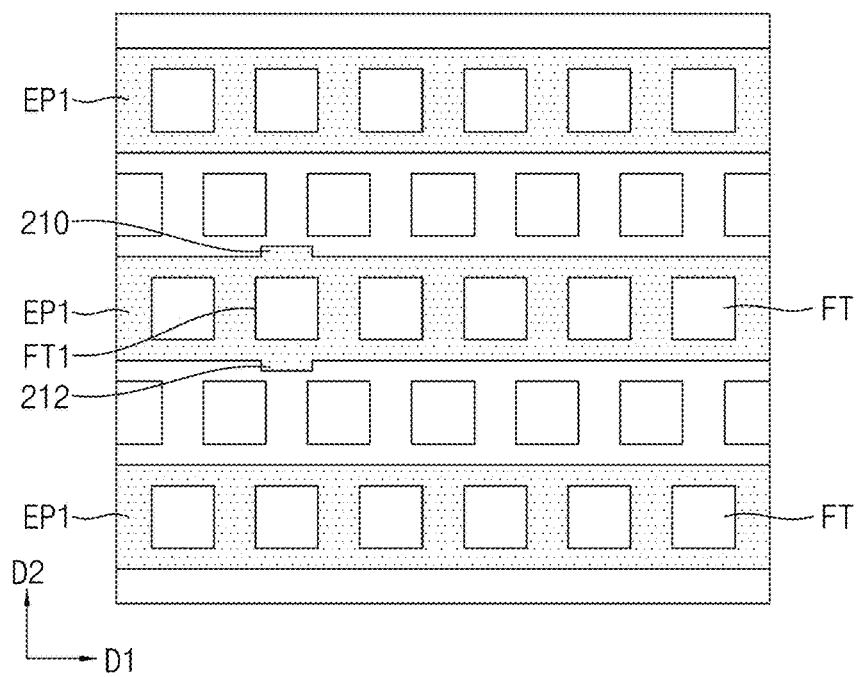

FIG. 3 is a flowchart illustrating a process included in a method of correcting a first target pattern, according to some example embodiments of inventive concepts. For example, FIG. 3 is a flowchart illustrating a method of performing a process (S120a) of correcting a first target pattern on the basis of an error pattern. FIGS. 4 and 5 are conceptual views of a method of correcting a first target pattern, according to some example embodiments of inventive concepts.

Referring to FIG. 3, the process (S120a) may include a process (S121a) of forming a marker layer overlapping a first final target, a process (S122a) of selecting a first error region from the marker layer, a process (S123a) of correcting the first error region on the basis of a skew value of the first target pattern and the error pattern, and a process (S124a) of reflecting the corrected first error region in the first target pattern.

FIG. 4 illustrates a process (S121a) of forming a marker layer MRK and a process (S122a) of selecting a first error region ER1. Referring to FIG. 4, a first target pattern TP1 may include a plurality of first extension patterns EP1. In some example embodiments, the plurality of first extension patterns EP1 may extend in a first horizontal direction D1 and may be apart from one another in a second horizontal direction D2. In some example embodiments, each of the plurality of first extension patterns EP1 may be a line pattern, but example embodiments are not limited thereto. For example, each of the plurality of first extension patterns EP1 may be or correspond to a line pattern including one or more protrusion patterns and/or recessed patterns.

A final target FT may represent a position of a final pattern which is to be formed on a substrate after an etching process and a cleaning process. In FIG. 4, each of a plurality of final targets FT is illustrated as quadrilateral/tetragonal, but example embodiments are not limited thereto. In some example embodiments, the final target FT may have a shape such as a circular shape, an oval shape, a hexagonal shape, or an octagonal shape. For example, a final pattern implemented on the substrate may be circular. The final targets FT may be arranged in rows at regular intervals, and adjacent rows may be disposed in zigzags. For example, the final targets FT may be disposed in a honeycomb structure or another lattice structure.

In some example embodiments, some final targets FT may not overlap the first extension pattern EP1. When double patterning technology is used, an after-etching final pattern may have a finer pitch than that of a pattern on a photoresist formed by a lithography process. For example, a pitch of the final target FT may be less than a pitch of the first extension patterns EP1, and some final targets FT may not overlap the first extension pattern EP1.

The first final target FT1 may denote a final target corresponding to an identified error pattern among the final targets FT. In some example embodiments, the first final target FT1 may overlap the first extension pattern EP1.

Regarding to the process (S121a) of forming the marker layer MRK, the marker layer MRK may be formed to overlap the first final target FT1 corresponding to an error pattern. For example, the marker layer MRK may extend in the second horizontal direction D2 across the first extension pattern EP1 and may be formed to partially overlap the first final target FT1. The marker layer MRK may be or correspond to a layer which differs from the first target pattern TP1.

Regarding to the process (S122a) of selecting the first error region ER1, a portion of the marker layer MRK overlapping the first extension pattern EP1 may be selected. For example, the first error region ER1 may be selected by using a Boolean operation, e.g. a Boolean operation on polygons (for example, an AND operation corresponding to an intersection of polygons).

FIG. 5 is a conceptual view illustrating a process (S123a) of correcting a first error region ER1 and a process (S124a) of reflecting the corrected first error region ER1 in a first target pattern TP1.

In some example embodiments, an error pattern may be or correspond to a pattern which is formed to be smaller than a final target FT. In this case, the process (S123a) of correcting the first error region ER1 may be a process of increasing a size of the first error region ER1. For example, in a case which corrects a first extension pattern EP1 extending in a first horizontal direction D1, the first error region ER1 may extend in a second horizontal direction D2 perpendicular to the first horizontal direction D1.

The correction may be based on a difference between the error pattern and the final target FT. For example, a skew value of a critical dimension (CD) of the error pattern and a CD of the final target FT may be considered. A length, by which the first error region ER1 extends, may be the same as or different from a difference between the CD of the error pattern and the CD of the final target FT.

Regarding to the process (S124a) of reflecting the corrected first error region ER1 in the first target pattern TP1, the corrected first error region ER1 may be reflected in/correspond to the first target pattern TP1 by using a Boolean operation (for example, an OR operation). FIG. 5 illustrates a corrected first target pattern TP1'. A portion of the corrected first target pattern TP1' corresponding to the first final target FT1 may be corrected. For example, the corrected first target pattern TP1' may include a serif/protrusion pattern 210 on the first final target FT1 and a serif/protrusion pattern 212 under the first final target FT1.

FIGS. 6 to 9 are conceptual views of a method of correcting a first mask layout, according to some example embodiments.

Figure 6:
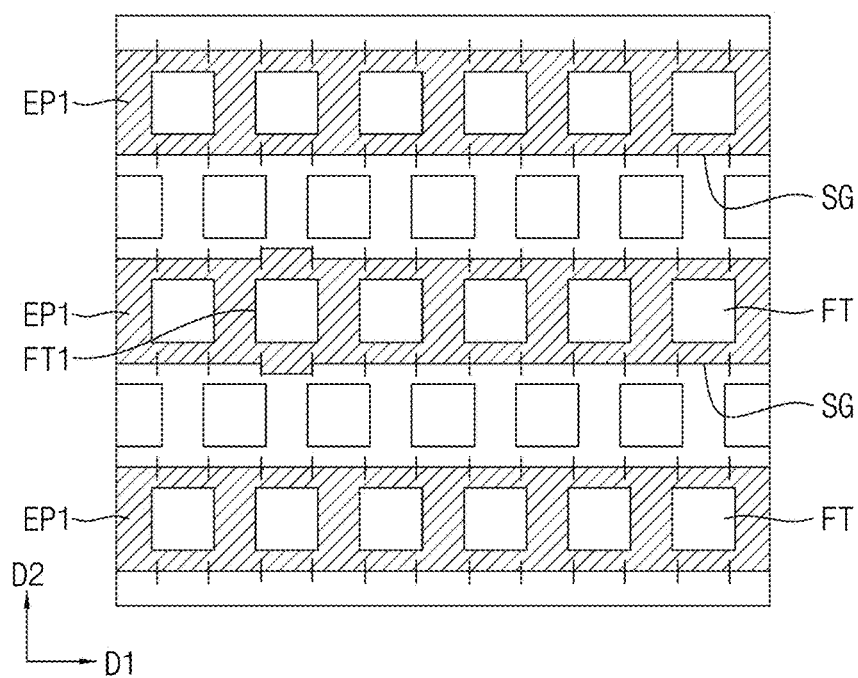
FIGS. 6 to 9 are conceptual views of a method of correcting a first mask layout, according to some example embodiments of inventive concepts.
Figure 7:
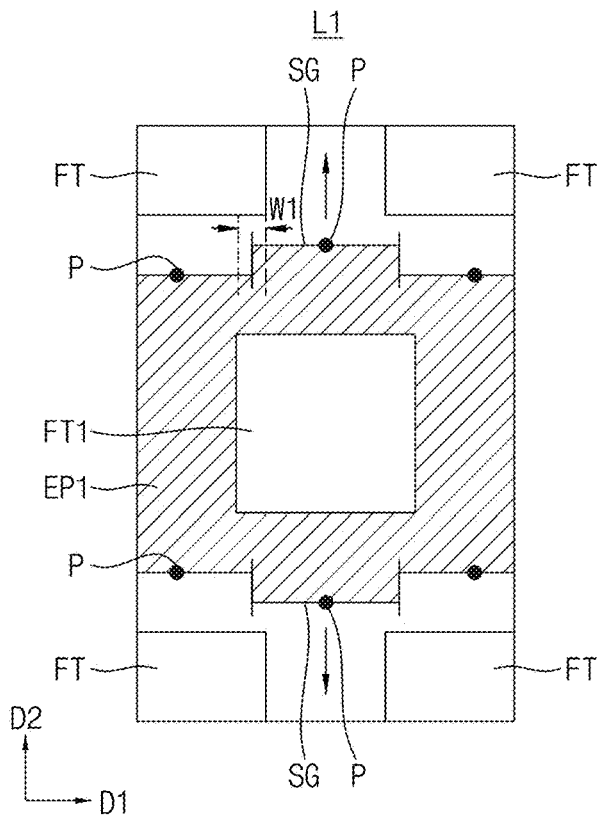
Figure 8:
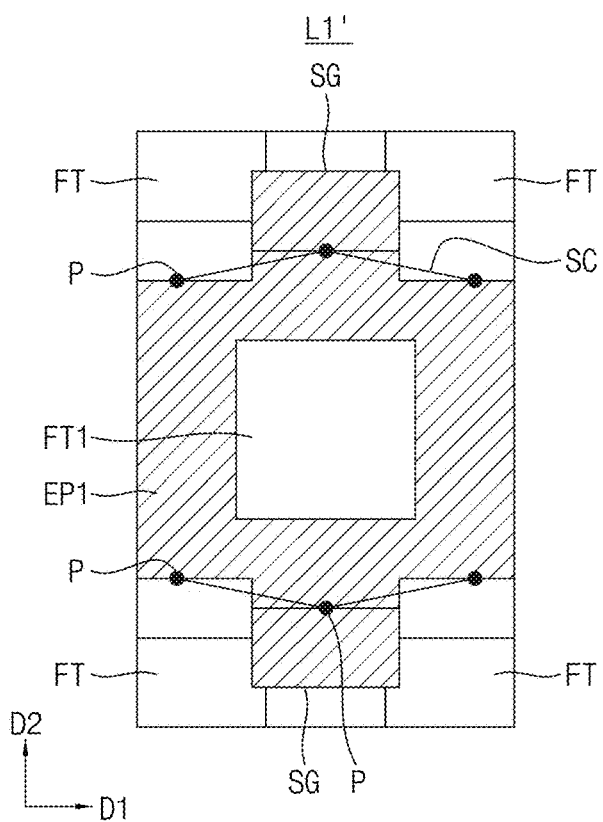

FIG. 6 is a conceptual view illustrating a method of fracturing and/or dissecting a first mask layout L1 on the basis of a corrected first target pattern TP1'. The first mask layout L1 may denote a layout of a first target pattern TP1 which is to be implemented on a photoresist. FIGS. 7 and 8 are conceptual views illustrating a process (S140a) of correcting the first mask layout L1. As described above, in terms of a characteristic of a lithography process, a target pattern to be implemented on the photoresist may differ from a layout of a photomask, and as the first target pattern TP1 is corrected to the corrected target pattern TP1', the first mask layout L1 is to be corrected.

Referring to FIG. 6, regarding to a process (S130a) of fracturing and/or dissecting a first mask layout L1 into a plurality of segments on the basis of a corrected first target pattern TP1', a first extension pattern EP1 of the first mask layout L1 may be fractured and/or dissected into a plurality of segments SG. Each of the plurality of segments SG may have the same length. Referring to FIG. 7, each of the segments SG may be disposed based on a position of a final target FT and may be disposed to correspond to only one final target FT. For example, a center point of a segment SG corresponding to a first final target FT1 among the plurality of segments SG may be aligned with a center point of the first final target FT1 in a second horizontal direction D2. Additionally or alternatively, each of a plurality of final targets FT may correspond to two segments SG. The final targets FT may be arranged in in a zigzag fashion such as a hexagonal lattice, and thus, in a case where a segment SG corresponding to the first final target FT1 is biased, adjacent final targets FT may be affected thereby. Therefore, an end point of each segment SG may be disposed/extended between an edge of the first final target FT1 and an edge of a final target FT adjacent to the first final target FT1 in the second horizontal direction D2. For example, the first final target FT1 may overlap an adjacent final target FT by a certain width W1 in the second horizontal direction D2, and the end point of each segment SG may be disposed at a center point of an overlapped portion. Additionally or alternatively, each segment SG may correspond to the protrusion patterns 210 and 212 illustrated in FIG. 5. Herein, a segment SG corresponding to the first final target FT1 may be referred to as a target segment.

The first mask layout L1 may be fractured and/or dissected so that a segment SG is disposed as described above, and thus, an error pattern may be more precisely adjusted. Alternatively or additionally, each segment SG may correspond to only one final target FT, and thus, a layout may be independently corrected on each final target FT.

A process (S140a) of correcting the first mask layout L1 may include a process of generating a target point P and a process of biasing a segment SG. Referring again to FIG. 7, the target point P (e.g. an evaluation point) may be generated on each segment SG along the first target pattern TP1.

Referring to FIG. 8, a corrected first mask layout L1' may be generated by biasing a segment SG. For example, a simulation such as an optical simulation based on the biased segment SG may be performed, and a first mask layout L1 may be corrected so that a simulation contour SC matches/intersects a target point P. For example, the segment SG may be biased so that a distance between the simulation contour SC and the target point P is equal to or less than a certain value. In some example embodiments, a plurality of segments SG may be biased in a positive direction. Here, the biasing performed in the positive direction may denote that a segment SG moves in a direction for increasing a width of a first extension pattern EP1 (or a second extension pattern EP2). Alternatively, biasing performed in a negative direction may denote that a segment SG moves in a direction for decreasing the width of the first extension pattern EP1 (or the second extension pattern EP2).

Figure 9:
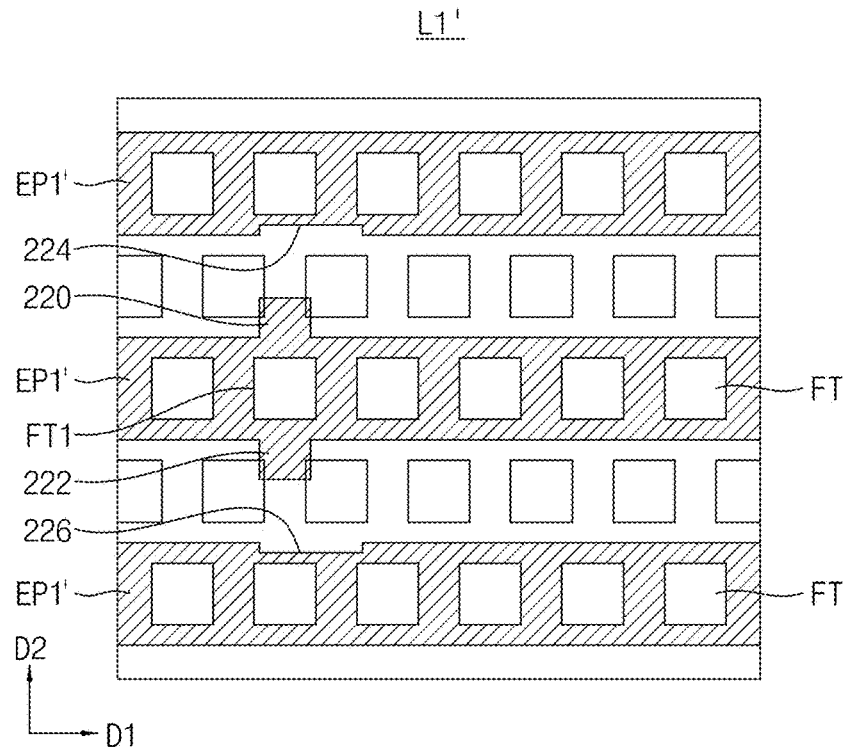

FIG. 9 illustrates a corrected first mask layout L1'. The corrected first mask layout L1' may include a plurality of first extension patterns EP1'. A corrected first extension pattern EP1' may include a protrusion pattern 220 on a first final target FT1 and a protrusion pattern 222 under the first final target FT1. In some example embodiments, the first extension patterns EP1 opposite to the protrusion patterns 220 and 222 may respectively include a plurality of recessed patterns 224 and 226. The recessed patterns 224 and 226 may prevent or reduce the amount and/or likelihood of deformation of the first extension pattern EP1 adjacent to the protrusion patterns 220 and 222. In some example embodiments, a recessed pattern may not be formed in the corrected first mask layout L1'.

FIGS. 10 to 13 are conceptual views of a method of correcting a first target pattern and a first mask layout, according to some example embodiments of inventive concepts.

Figure 10:
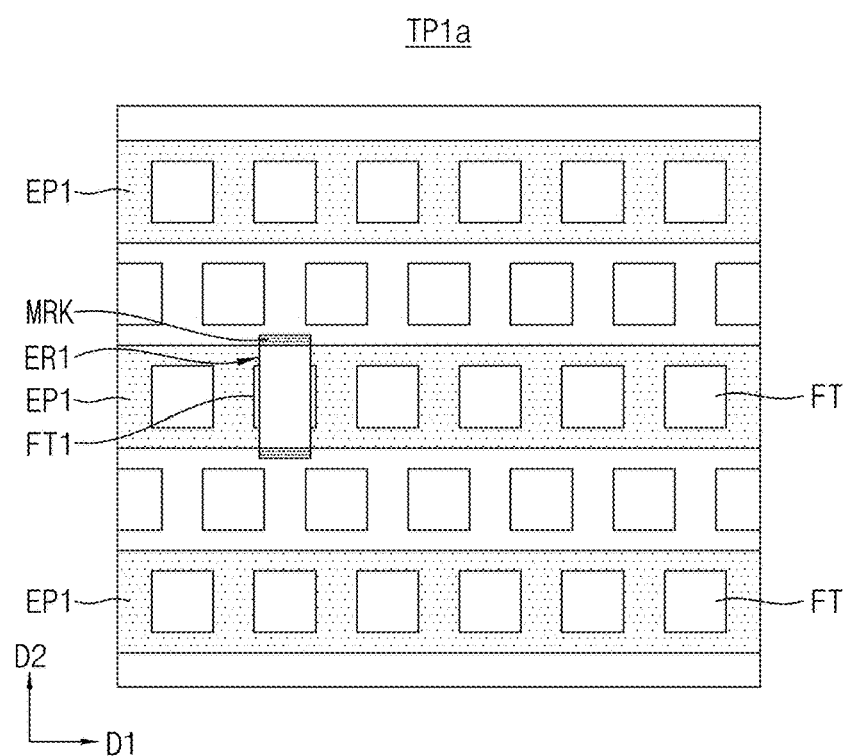
FIGS. 10 to 13 are conceptual views of a method of correcting a first target pattern and a first mask layout, according to some example embodiments of inventive concepts.
Figure 11:
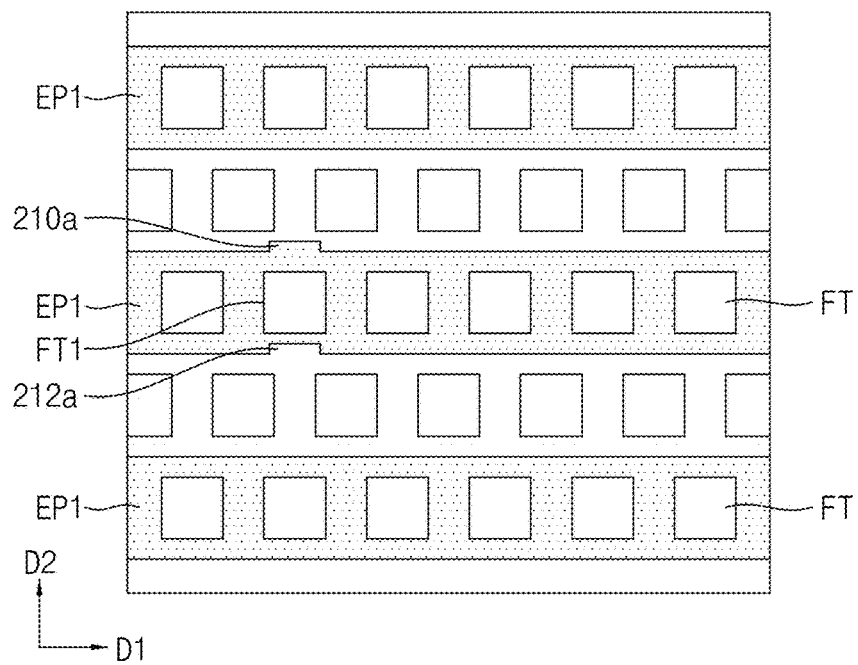

FIGS. 10 and 11 illustrate a process of correcting a first target pattern TP1a. The process of correcting the first target pattern TP1a may include a process (S121a) of forming a marker layer MRK described above with reference to FIGS. 3 and 4, a process (S122a) of selecting a first error region ER1, and a process (S123a) of correcting the first error region ER1. In some example embodiments, an error pattern may be or correspond to a pattern in which a pattern shift has occurred with respect to a final target FT. For example, the error pattern may be misaligned with the other final patterns. In this case, the process (S123a) of correcting the first error region ER1 may be or correspond to a process of moving the first error region ER1 in a direction opposite to a direction in which the error pattern is misaligned.

FIG. 11 illustrates a corrected first target pattern TP1'a. A portion of the first target pattern TP1a corresponding to the first final target FT1 may be corrected. When an error pattern is disposed downward from the other final targets FT, the portion of the first target pattern TP1a corresponding to the first final target FT1 may be corrected upward in a second horizontal direction D2. For example, the first target pattern TP1'a may include a serif/protrusion pattern on the first final target FT1 and a recessed pattern under the first final target FT1.

Figure 12:
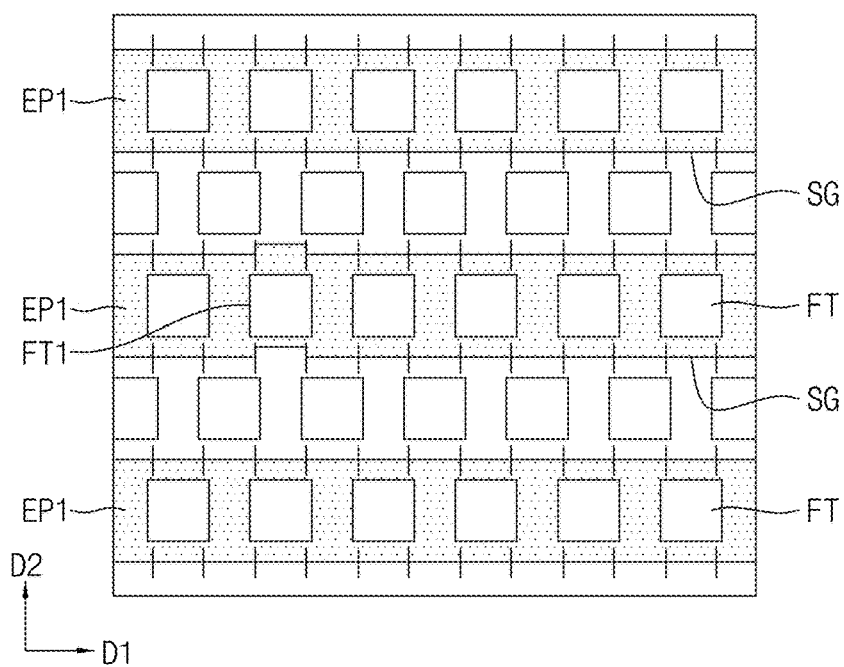

FIG. 12 is a conceptual view illustrating a method of fracturing and/or dissecting a first mask layout L1a on the basis of a corrected first target pattern TP1a. The first mask layout L1a may be fractured and/or dissected based on an error pattern, and a fracturing and/or dissection method may be the same as the method described above with reference to FIGS. 6 and 7. For example, each of a plurality of segments SG may have the same length, and a segment SG between two final targets FT adjacent to each other in a second horizontal direction D2 may be disposed so that an end point of the segment SG is disposed between edges of the two final targets FT.

Figure 13:
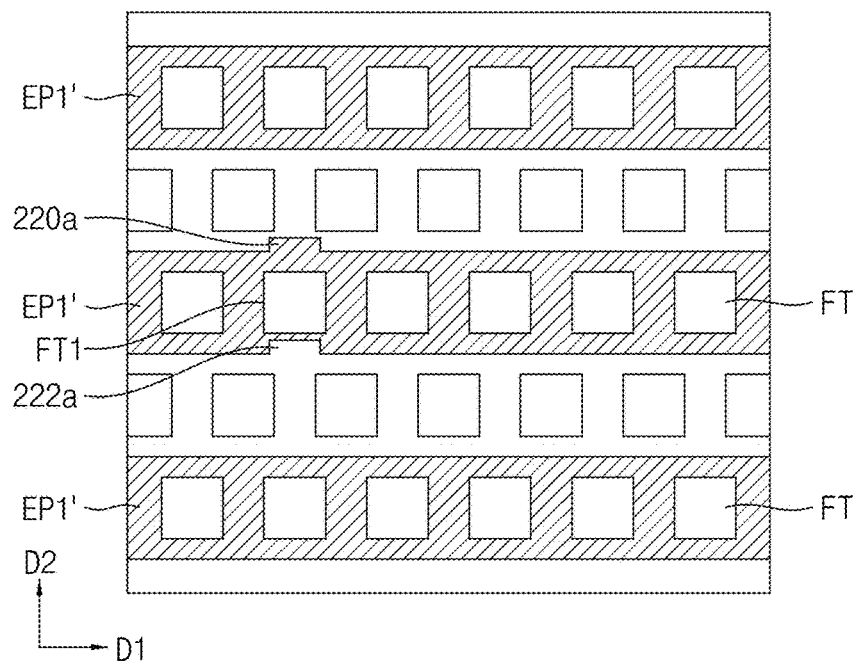

FIG. 13 illustrates a corrected first mask layout L1'a. The corrected first mask layout L1'a may include a plurality of first extension patterns EP1'. A segment SG may be biased in a direction opposite to a direction in which an error pattern is misaligned. For example, a corrected first extension pattern EP1' may include a protrusion pattern 220a on a first final target FT1 and a recessed pattern 222a under the first final target FT1.

Figure 14:
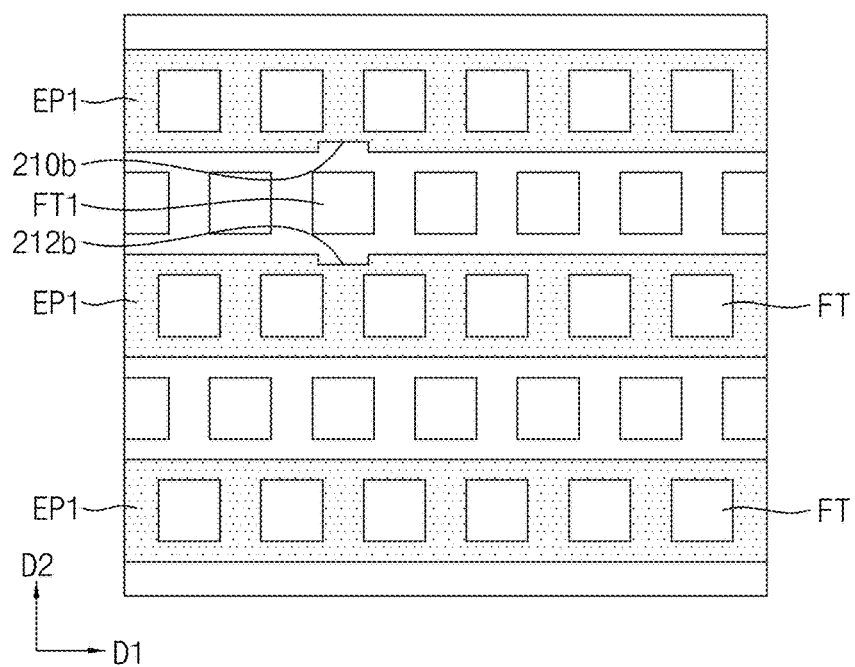
FIGS. 14 to 16 are conceptual views of a method of correcting a first target pattern and a first mask layout, according to some example embodiments of inventive concepts.
Figure 15:
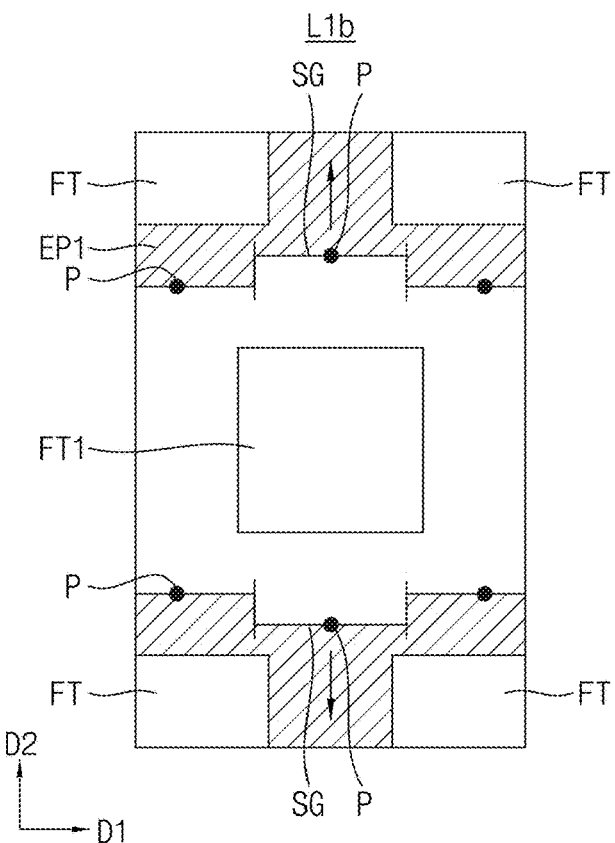
Figure 16:
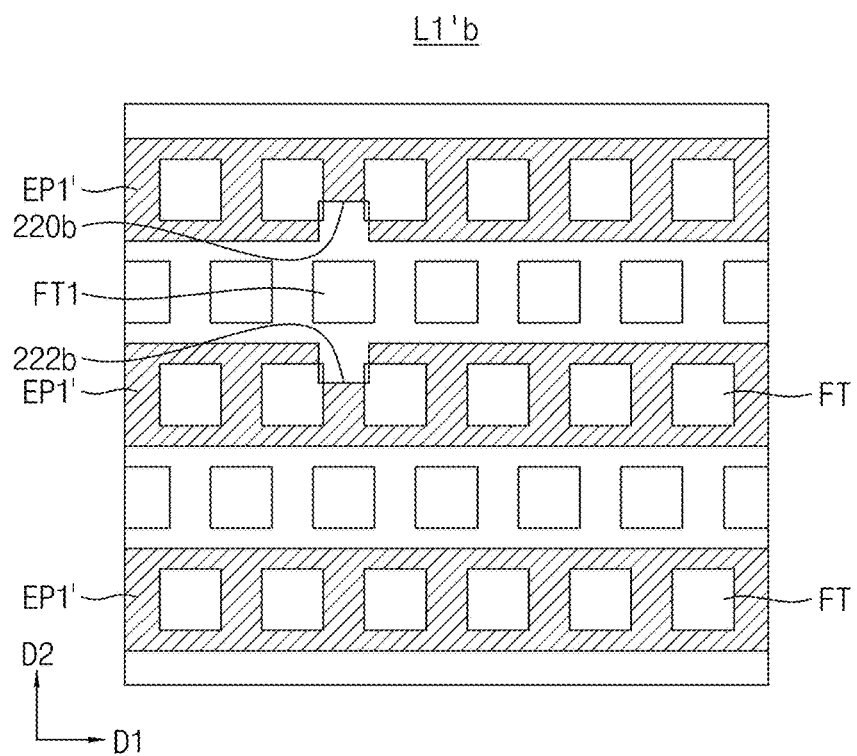

FIGS. 14 to 16 are conceptual views of a method of correcting a first target pattern and a first mask layout, according to some example embodiments of inventive concepts.

FIG. 14 illustrates a corrected first target pattern TP1'b. In some example embodiments, an error pattern may not overlap a first extension pattern EP1 and may be a pattern which is formed to be smaller than a final target FT. For example, the first final target FT1 may not overlap the first extension pattern EP1. A process of correcting the first target pattern TP1'b may be performed similar to the method described above with reference to FIG. 4. The corrected first target pattern TP1'b may include a recessed pattern 210b on the first final target FT1 and a recessed pattern 212b under the first final target FT1.

FIGS. 15 and 16 are conceptual views of a method of correcting a first mask layout.

Referring to FIG. 15, a first mask layout L1b may be fractured and/or dissected by a plurality of segments SG, and a target point P may be generated on each of the segments SG along a first target pattern TP1. A method of fracturing and/or dissecting a first extension pattern EP1 of the first mask layout L1b may be as described above with reference to FIGS. 6 and 7. In some example embodiments, a segment SG corresponding to a first final target FT1 may be biased in a negative direction.

FIG. 16 illustrates a corrected first mask layout L1'b. The corrected first mask layout L1'b may include a plurality of first extension patterns EP1'. A corrected first extension pattern EP1' may include a protrusion pattern 220b on a first final target FT1 and a recessed pattern 222b under the first final target FT1.

Figure 17:
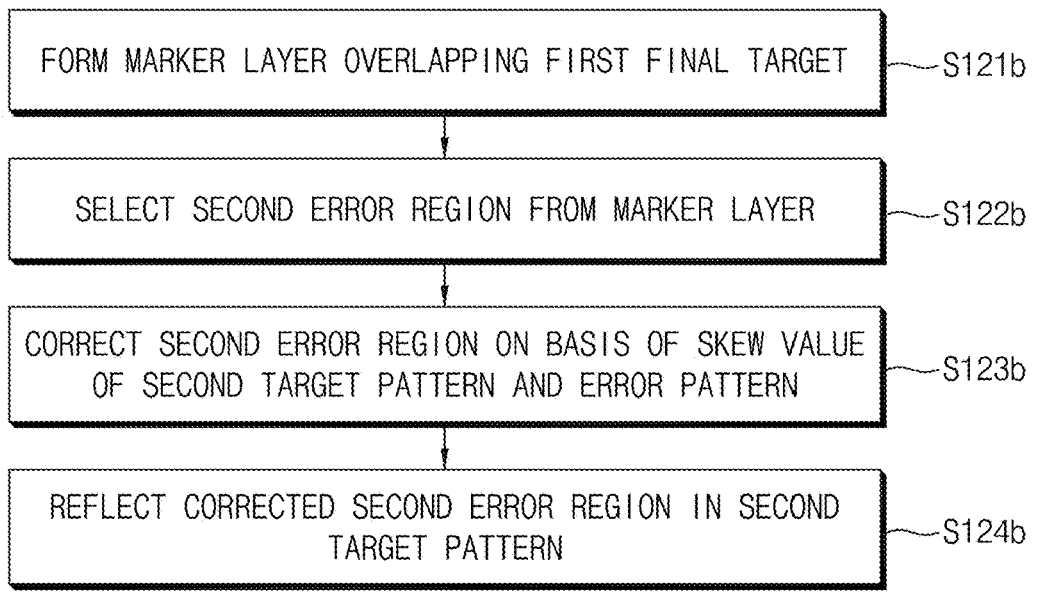
FIG. 17 is a flowchart illustrating a process included in a method of correcting a second target pattern, according to some example embodiments of inventive concepts.
Figure 18:
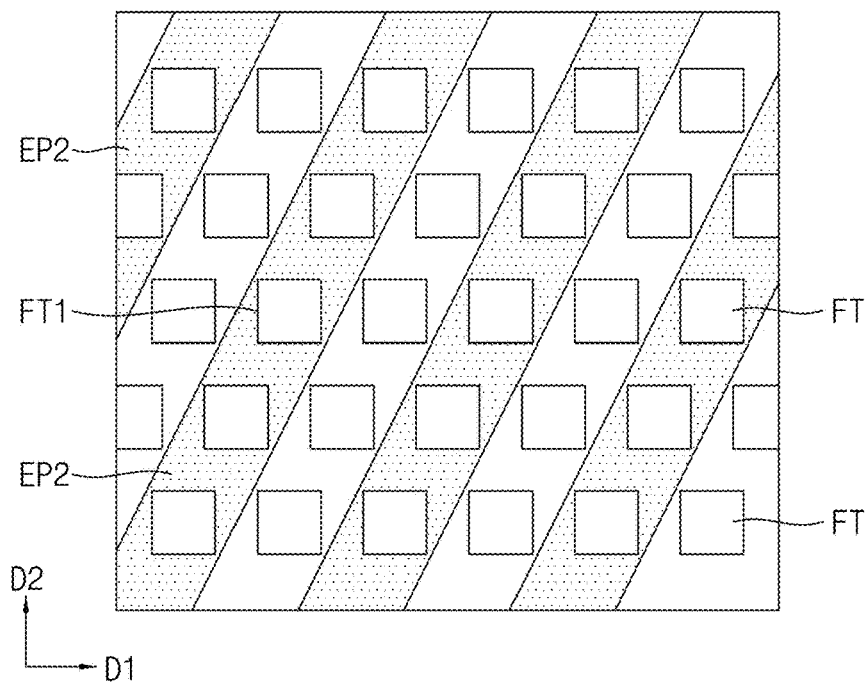
FIGS. 18 to 21 are conceptual views of a method of correcting a second target pattern, according to some example embodiments of inventive concepts.
Figure 19:
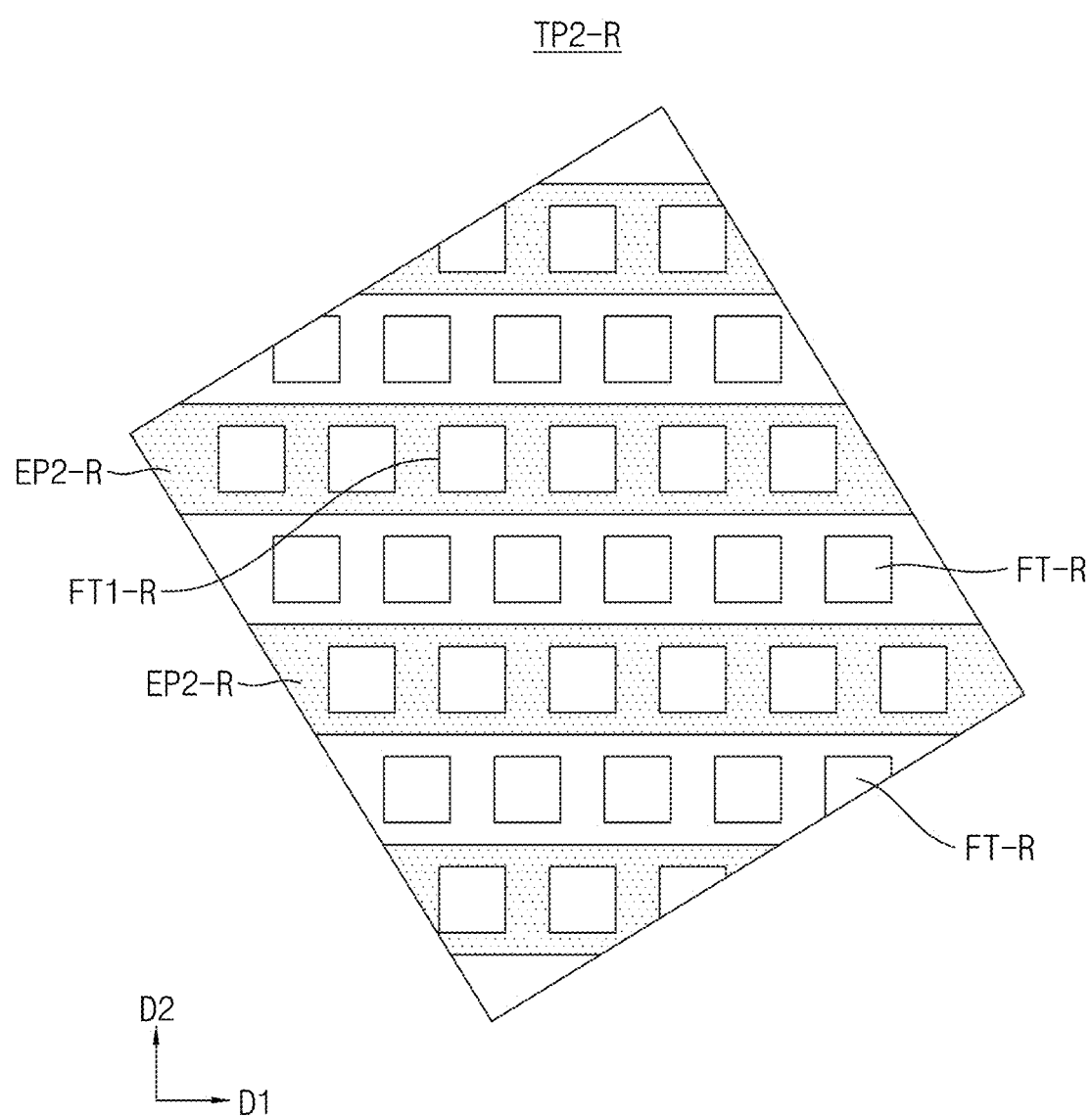
Figure 20:
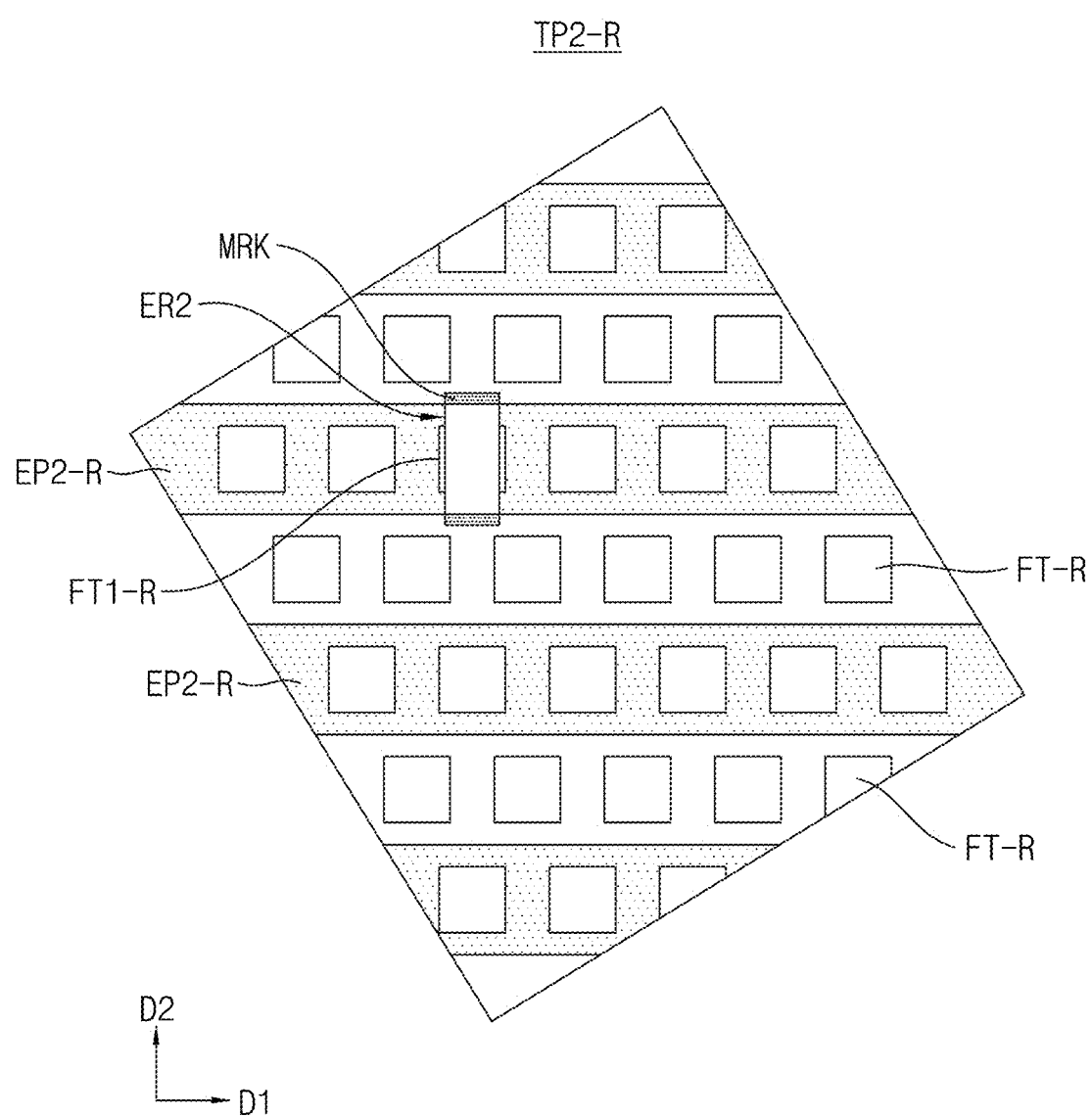

FIG. 17 is a flowchart illustrating a process included in a method of correcting a second target pattern, according to some example embodiments. For example, FIG. 17 is a flowchart illustrating a method of performing a process (S120b) of correcting a second target pattern on the basis of an error pattern. FIGS. 18 to 20 are conceptual views of a method of correcting a second target pattern, according to some example embodiments.

Referring to FIG. 17, the process (S120b) may include a process (S121b) of forming a marker layer overlapping a first final target, a process (S122b) of selecting a second error region from the marker layer, a process (S123b) of correcting the second error region on the basis of a skew value of the second target pattern and the error pattern, and a process (S124b) of reflecting the corrected second error region in the second target pattern.

FIGS. 18 to 21 are conceptual views of a method of correcting a second target pattern, according to some example embodiments of inventive concepts.

FIG. 18 illustrates a second target pattern TP2. The second target pattern TP2 may be or correspond to a layer which differs from a first target pattern TP1 and may have a shape which differs from that of the first target pattern TP1. For example, the second target pattern TP2 may include a plurality of extension patterns EP2 extending in a direction intersecting with a first horizontal direction D1. In some example embodiments, the second extension pattern EP2 may be a line pattern extending in a diagonal direction. For example, the second extension pattern EP2 may extend in a direction askew with respect to the first extension pattern EP1, by a skew angle such as an angle between 45 degrees and 80 degrees inclusive with respect to the first direction D1.

Referring to FIG. 19, a second target pattern TP2 may rotate. A rotated second target pattern TP2-R may include a rotated second extension pattern EP2-R, a rotated final target FT-R, and a rotated first final target FT1-R. For example, a plurality of second extension patterns EP2 may rotate to be aligned in a first horizontal direction D1 (or to be parallel to the first horizontal direction D1). A plurality of final targets FT, for example, may rotate so that a quadrilateral edge/tetragonal edge is parallel to the first horizontal direction D1.

FIG. 20 is a conceptual view illustrating a process (S121b) of forming a marker layer MRK and a process (S122b) of selecting a second error region ER2.

Regarding to the process (S121b) of forming the marker layer MRK, the marker layer MRK may be formed to overlap a first final target FT1-R corresponding to an error pattern. For example, the marker layer MRK may extend in a second horizontal direction D2 across a second extension pattern EP2-R and may be formed to partially overlap the first final target FT1-R. Regarding to the process (S122b) of selecting the second error region ER2, a second error region ER2 where the marker layer MRK overlaps the second extension pattern EP2-R may be selected.

Subsequently, a process (S123b) of correcting the second error region ER2 and a process (S124b) of reflecting a corrected second error region ER2 in the second target pattern TP2-R may be performed. In some example embodiments, an error pattern may be a pattern which is formed to be smaller than a final target FT-R. Accordingly, the process (S123b) of correcting the second error region ER2 may be a process of increasing a size of the second error region ER2.

Figure 21:
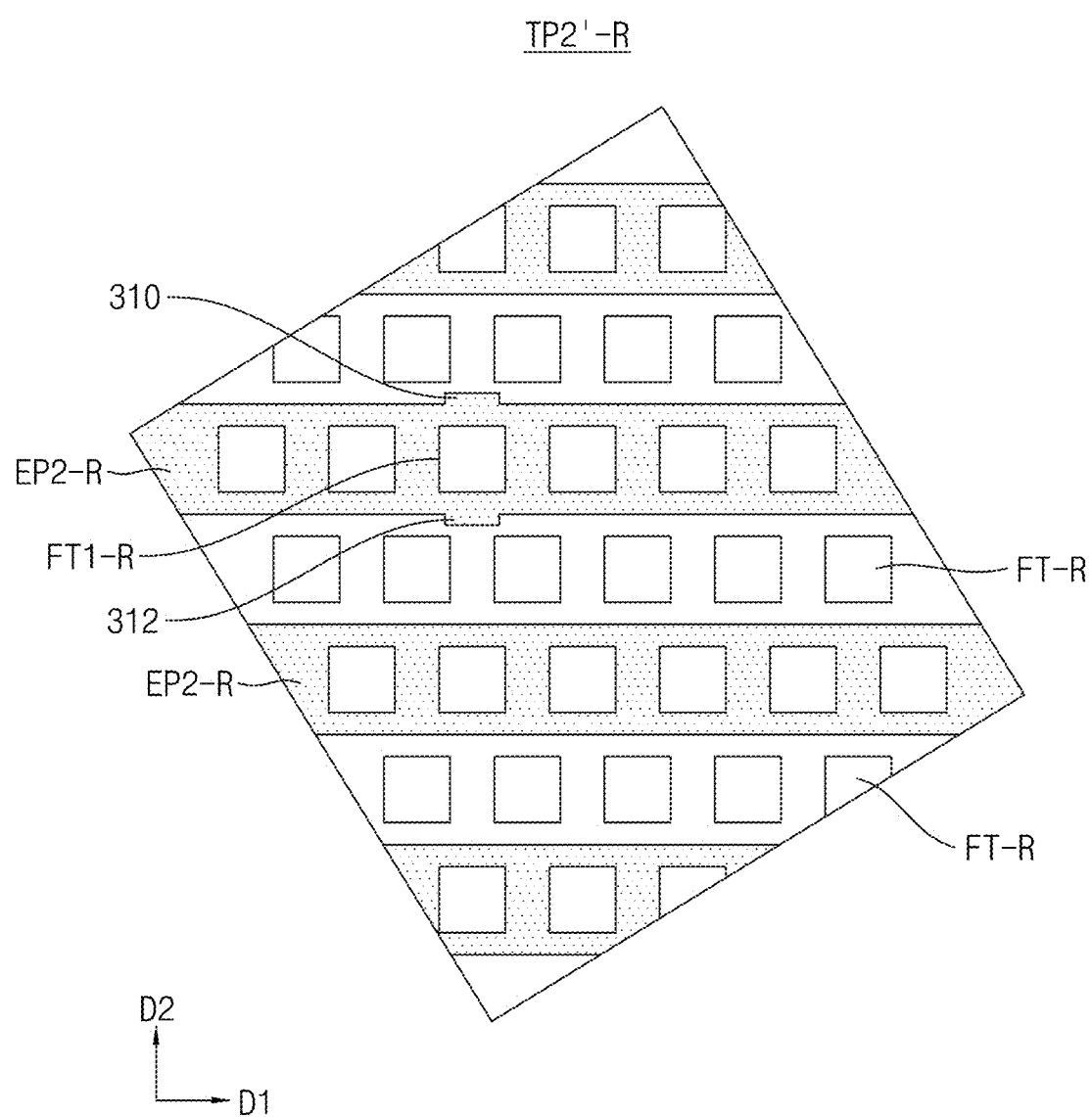

FIG. 21 illustrates a corrected second target pattern TP2'-R. A portion of the second target pattern TP2'-R corresponding to a first final target FT1-R may be corrected by reflecting a corrected second error region ER2. For example, the second target pattern TP2'-R may include a protrusion pattern 310 on the first final target FT1-R and a protrusion pattern 312 on the first final target FT1-R.

FIGS. 22 to 25 are conceptual views of a method of correcting a second mask layout L2, according to some example embodiments of inventive concepts.

Figure 22:
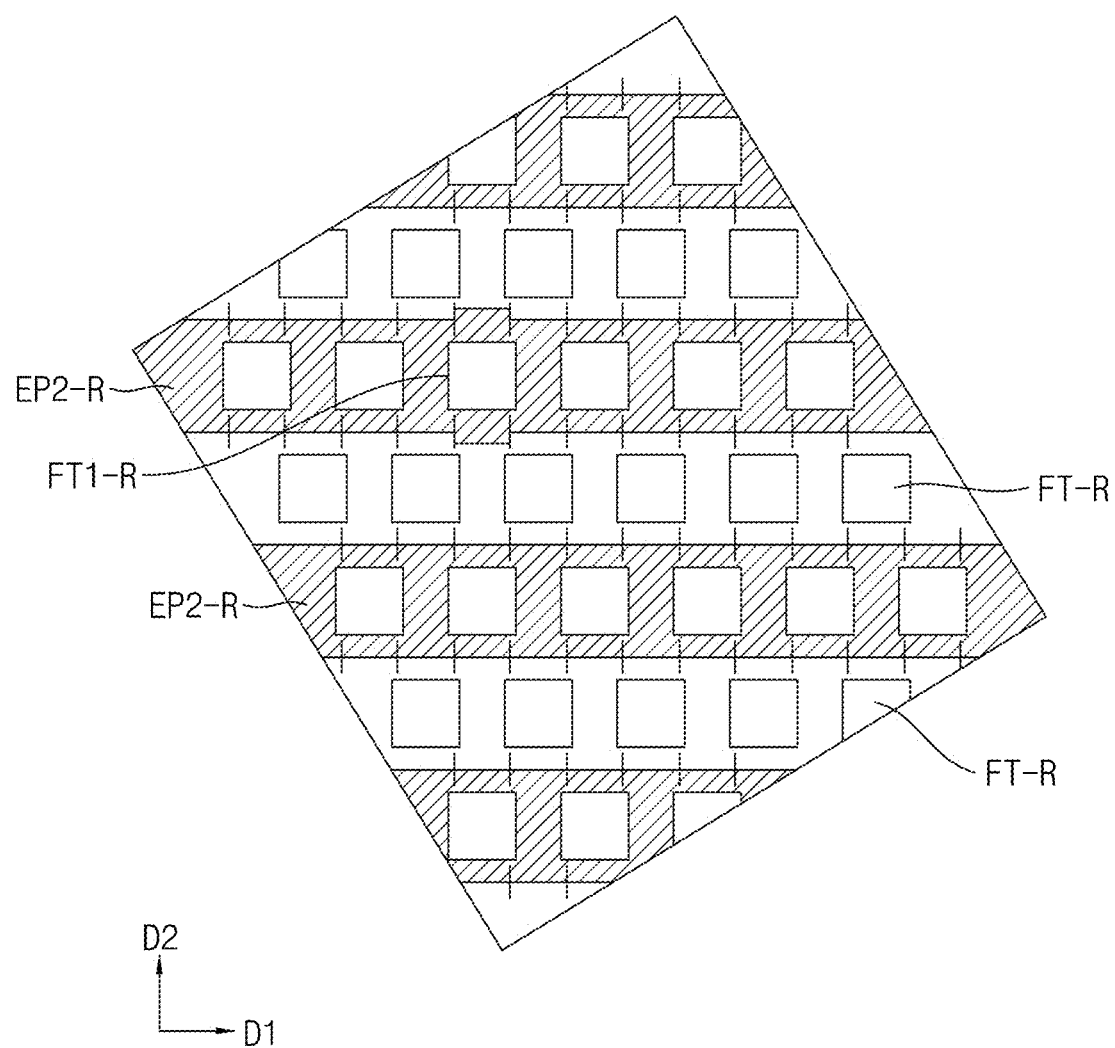
FIGS. 22 to 25 are conceptual views of a method of correcting a second mask layout, according to some example embodiments of inventive concepts.
Figure 23:
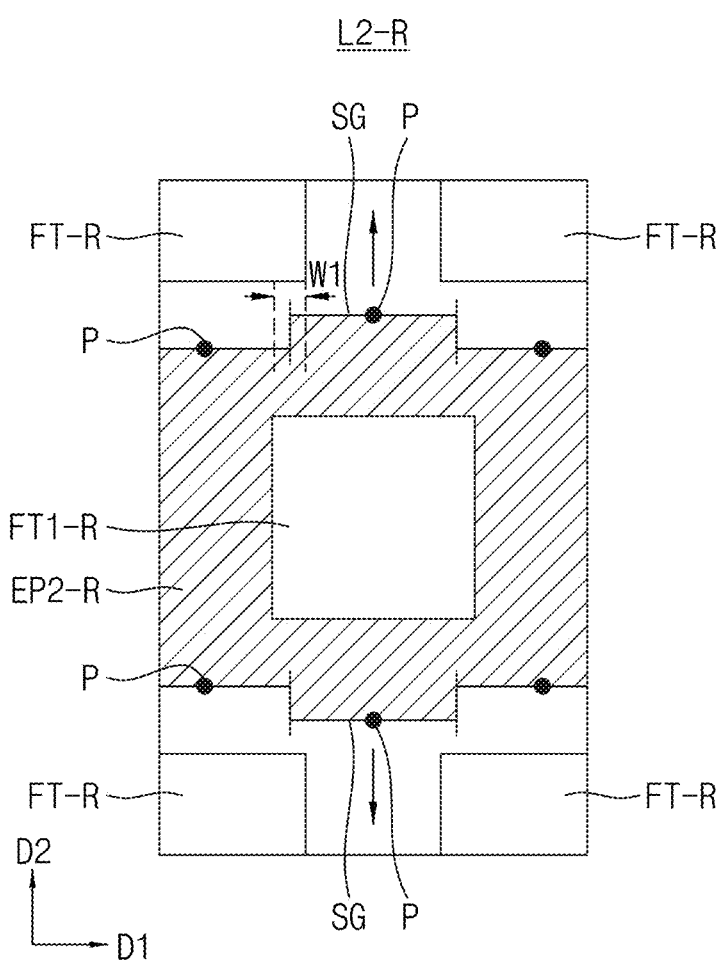

FIG. 22 is a conceptual view illustrating a method of fracturing and/or dissecting a second mask layout L2-R on the basis of a corrected second target pattern TP2'-R. FIG. 23 is a conceptual view illustrating a process (S140b) of correcting the second mask layout L2-R. The second mask layout L2-R may denote a layout of a second target pattern TP2-R which is to be implemented on a photoresist.

Referring to FIGS. 22 and 23, a second extension pattern EP2-R of the second mask layout L2-R may be fractured and/or dissected into a plurality of segments SG, and a target point P may be generated on each of the plurality of segments S along a second target pattern TP2'-R. A method of fracturing and/or dissecting the second extension pattern EP2-R may be as described above with reference to FIGS. 6 and 7. An end point of each segment SG may be disposed between an edge of a first final target FT1-R and an edge of a final target FT-R adjacent to the first final target FT1-R in a second horizontal direction D2. For example, the first final target FT1-R may overlap an adjacent final target FT-R by a certain width W1 in the second horizontal direction D2, and the end point of each segment SG may be disposed at a center point of an overlapped portion. The plurality of segments SG may be biased in a positive direction.

Figure 24:
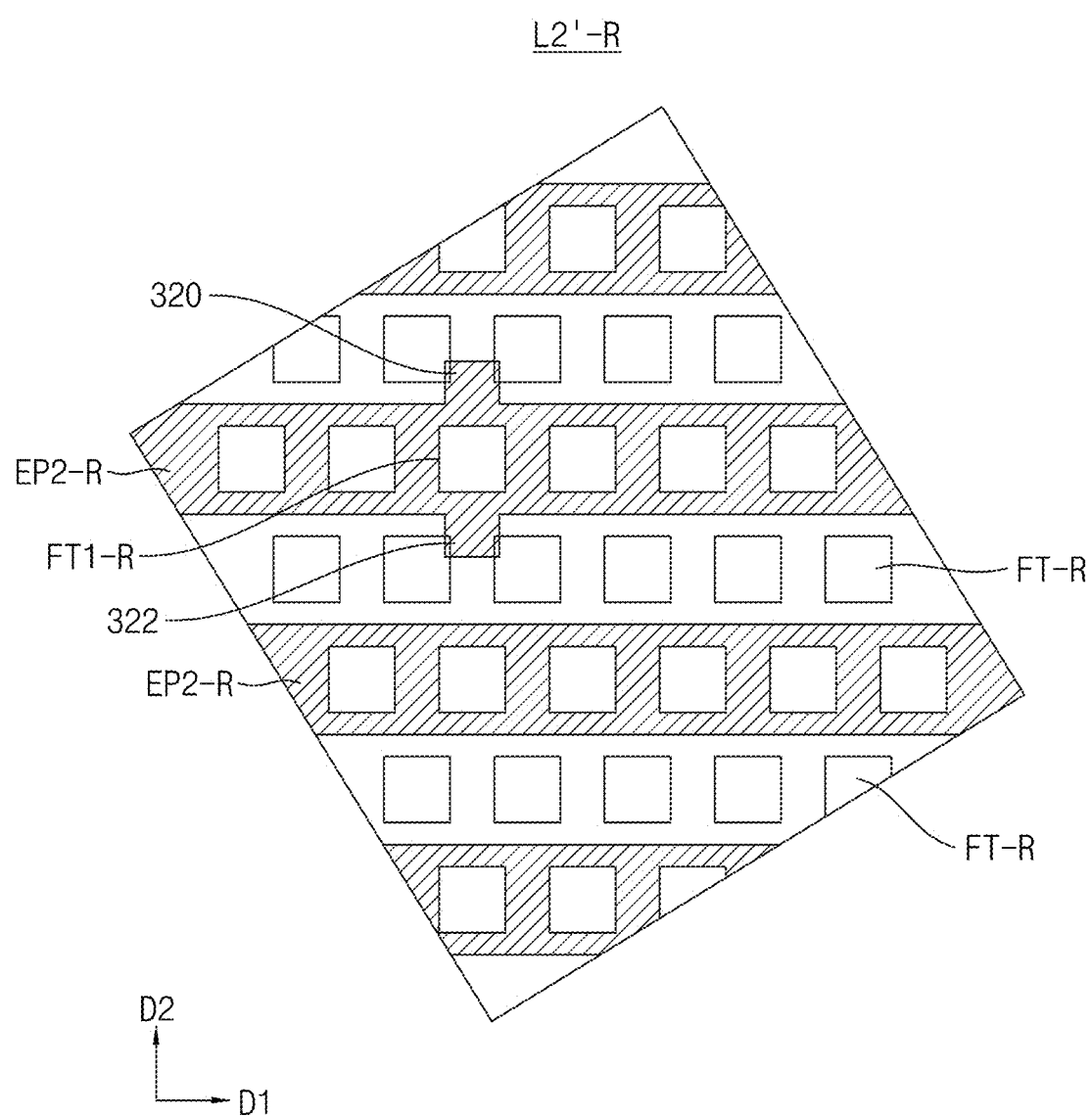

FIG. 24 illustrates a corrected second mask layout L2'-R. The corrected second mask layout L2'-R may include a plurality of second extension patterns EP2-R. A corrected second extension pattern EP2-R may include a protrusion pattern 320 on a first final target FT1-R and a protrusion pattern 322 under the first final target FT1-R.

Figure 25:
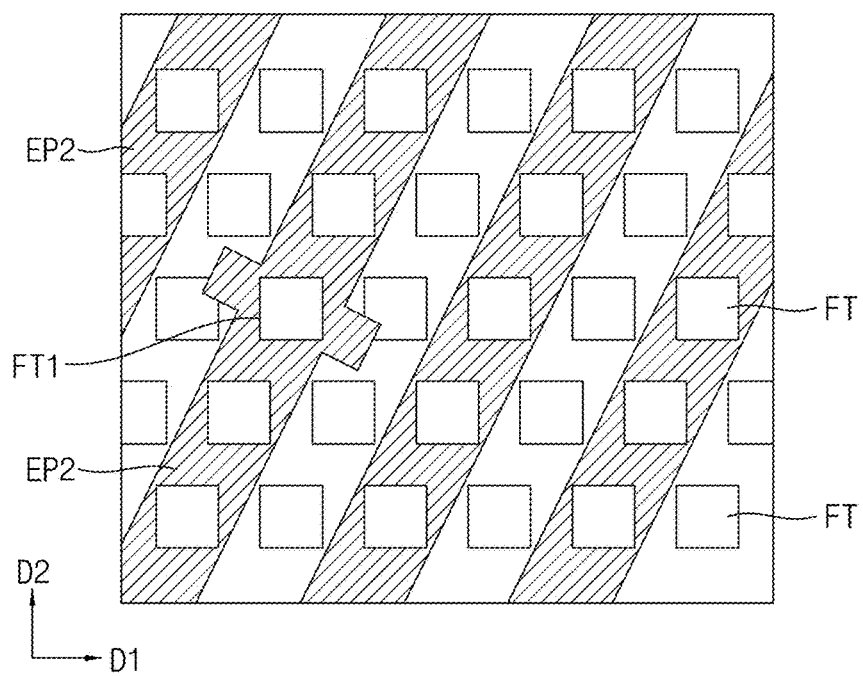

FIG. 25 illustrates a rotated second mask layout L2'. The correction of a second mask layout L2 may be completed by again rotating a second mask layout L2'-R.

In a case which extends a second extension pattern EP2 in a diagonal direction which is not parallel to a first horizontal direction D1 and a second horizontal direction D2, as described above with reference to FIGS. 18 to 25, correction may be performed by rotating a second target pattern TP2 and a second mask layout L2. However, inventive concepts are not limited thereto, and in some example embodiments, the second target pattern TP2 and the second mask layout L2 may not rotate. In some example embodiments, edges of a plurality of second extension patterns EP2 and final targets FT may rotate to be parallel to one another in the second horizontal direction D2.

FIGS. 26 to 30 are conceptual views of a method of correcting a first target pattern and a first mask layout, according to some example embodiments of inventive concepts.

In some example embodiments, final targets FT of a first target pattern TP1c may be disposed in a lattice structure. For example, the final targets FT may be apart from one another by a certain interval in a first horizontal direction D1 and a second horizontal direction D2. As described below with reference to FIG. 31, when a second extension pattern EP2 is perpendicular to a first extension pattern EP1, the final targets FT may be disposed in a lattice structure.

Figure 26:
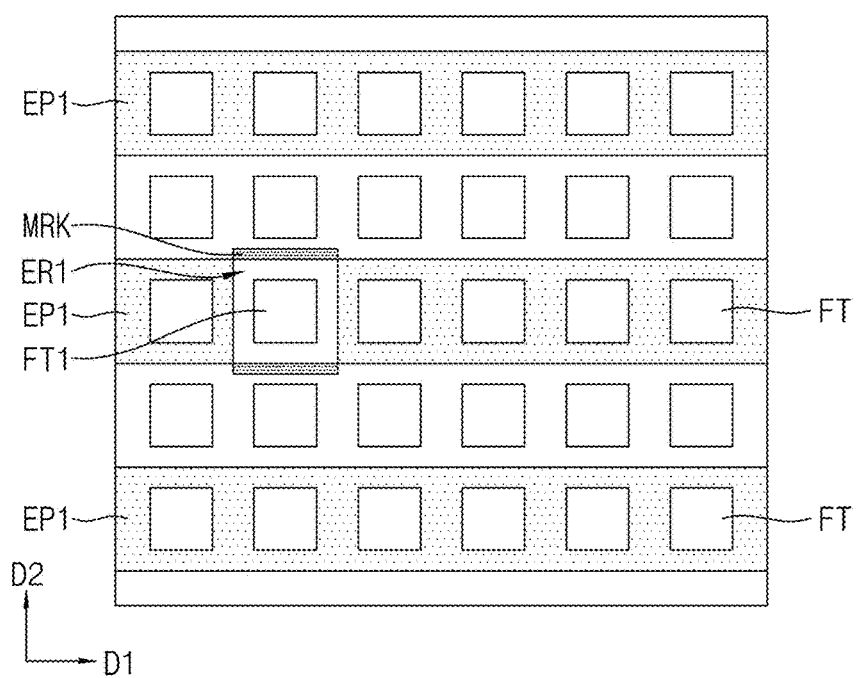
FIGS. 26 to 30 are conceptual views of a method of correcting a first target pattern and a first mask layout, according to some example embodiments of inventive concepts.

FIG. 26 is a conceptual view illustrating a process (S121a) of forming a marker layer MRK and a process (S122a) of selecting a first error region ER1. The process (S121a) of forming the marker layer MRK and the process (S122a) of selecting the first error region ER1 may be performed similar to the description of FIG. 4.

Subsequently, a process (S123a) of correcting the first error region ER1 and a process (S124a) of reflecting a corrected second error region ER1 in a first target pattern TP1 may be performed. In some example embodiments, an error pattern may be a pattern which is formed to be smaller than a final target FT. In this case, the process (S123a) of correcting the first error region ER1 may be a process of increasing a size of the first error region ER1.

Figure 27:
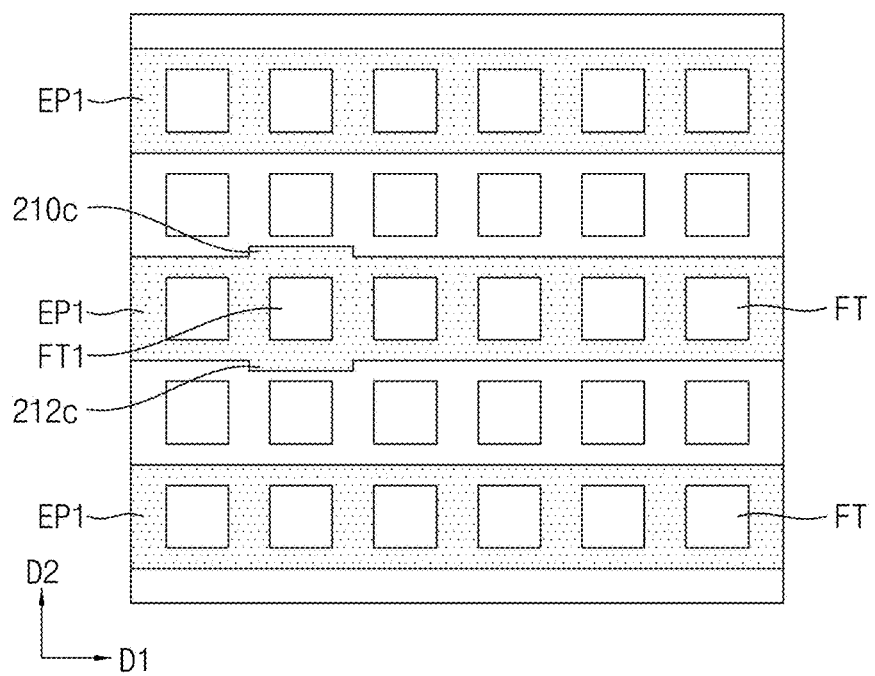

FIG. 27 illustrates a corrected first target pattern TP1'c. A portion of a first target pattern TP1 corresponding to a first final target FT1 may be corrected. For example, the corrected first target pattern TP1'c may include a protrusion pattern 210c on the first final target FT1 and a protrusion pattern 212c under the first final target FT1.

Figure 28:
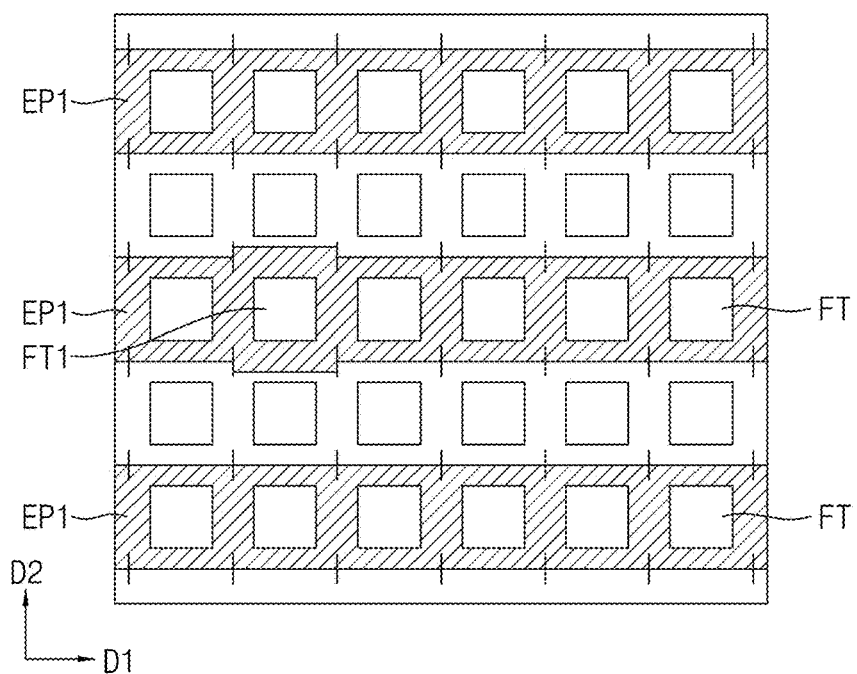
Figure 29:
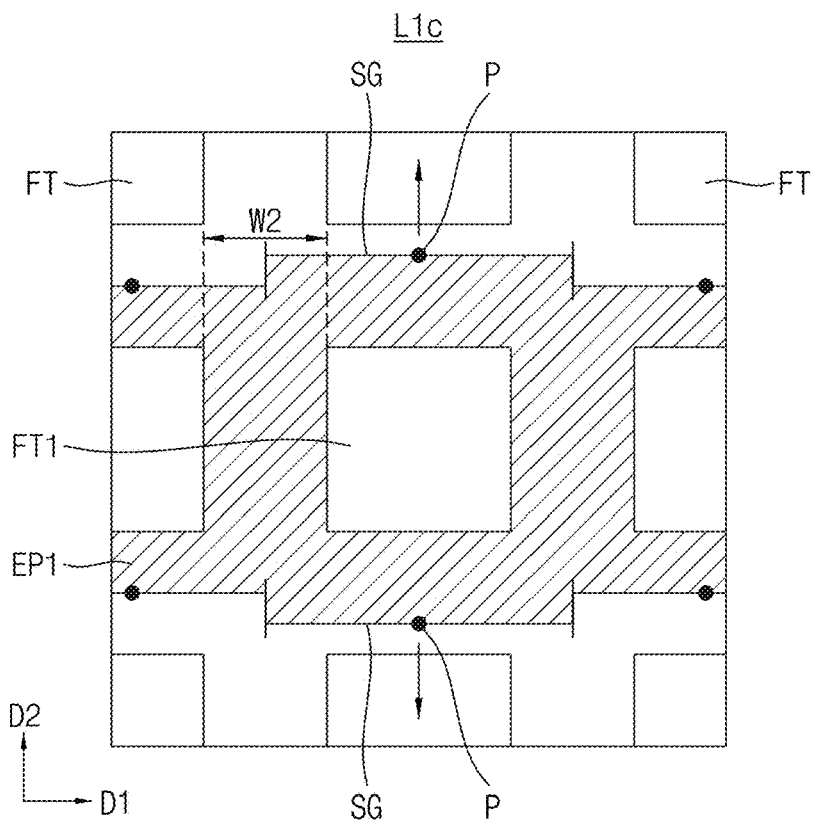

FIG. 28 is a conceptual view illustrating a method of fracturing and/or dissecting a first mask layout L1c on the basis of a corrected first target pattern TP1. FIG. 29 is a conceptual view illustrating a process (S140a) of correcting the first mask layout L1c.

Referring to FIGS. 28 and 29, a first extension pattern EP1 of the first mask layout L1c may be fractured and/or dissected into a plurality of segments SG, and a target point P may be generated on each of the plurality of segments S along a first target pattern TP1'c. Each segment SG may be disposed based on a position of a final target FT. For example, a center point of a segment SG corresponding to a first final target FT1 among the plurality of segments SG may be aligned with a center point of the first final target FT1 in a second horizontal direction D2. In some example embodiments, an end point of each segment SG may be disposed at a center point between an edge of the first final target FT1 and an edge of a final target FT adjacent to the first final target FT1 in a first horizontal direction D1. For example, the first final target FT1 may be apart from the final target FT adjacent thereto by a certain width W2 in the first horizontal direction D1, and the end point of each segment SG may be disposed to halve the width W2. Additionally or alternatively, each segment SG may correspond to the protrusion patterns 210c and 212c illustrated in FIG. 27. The plurality of segments SG may be biased in a positive direction.

Figure 30:
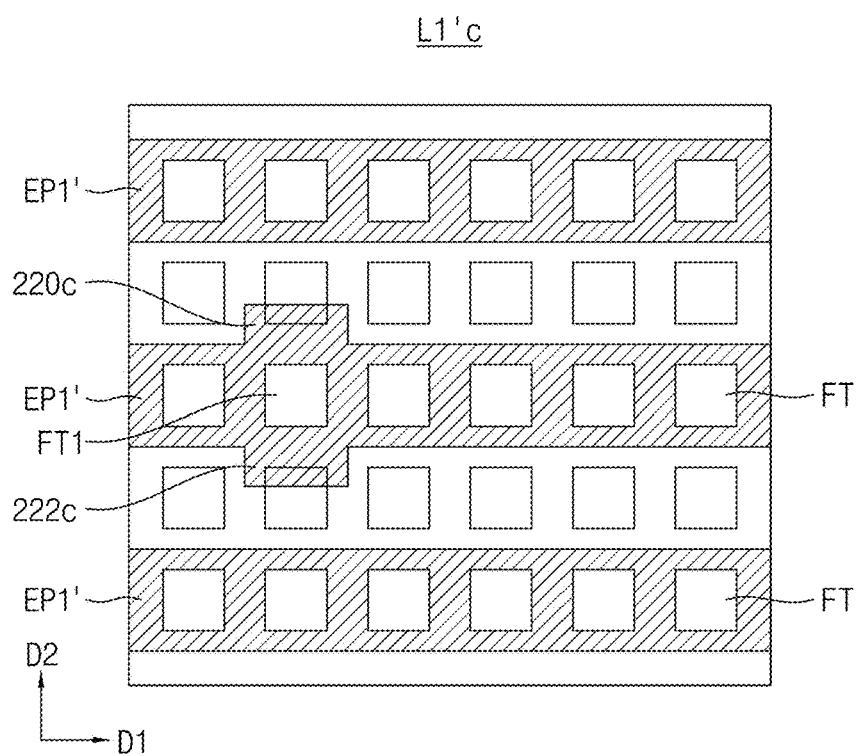

FIG. 30 illustrates a corrected first mask layout L1'c. The corrected first mask layout L1'c may include a plurality of first extension patterns EP1'. A corrected first extension pattern EP1' may include a protrusion pattern 220c on a first final target FT1 and a protrusion pattern 222c under the first final target FT1.

FIGS. 31 to 34 are conceptual views of a method of correcting a second target pattern and a second mask layout, according to some example embodiments of inventive concepts.

Figure 31:
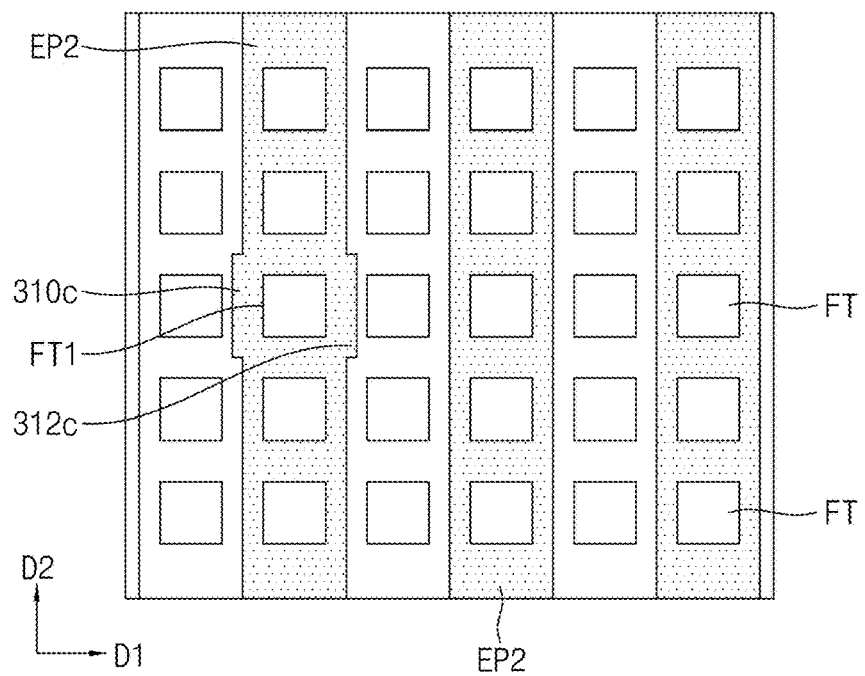
FIGS. 31 to 34 are conceptual views of a method of correcting a second target pattern and a second mask layout, according to some example embodiments of inventive concepts.

FIG. 31 illustrates a corrected second target pattern TP2'c. The corrected second target pattern TP2'c may include a plurality of second extension patterns EP2. In some example embodiments, the plurality of second extension patterns EP2 may extend in a second horizontal direction D2 and may be apart from one another in a first horizontal direction D1. In some example embodiments, an error pattern corresponding to a first final pattern may be a pattern which is formed to be smaller than a final target FT. A portion of a second target pattern TP2 corresponding to a first final target FT1 may be corrected. For example, the corrected second target pattern TP2'c may include a protrusion pattern 310c to the left of the first final target FT1 and a protrusion pattern 312c to the right of the first final target FT1.

Figure 32:
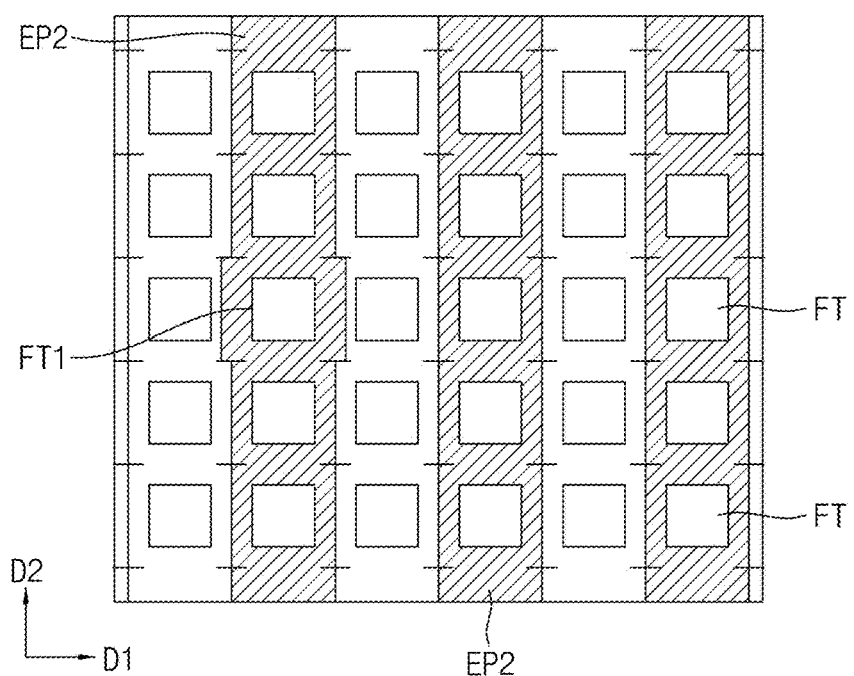
Figure 33:
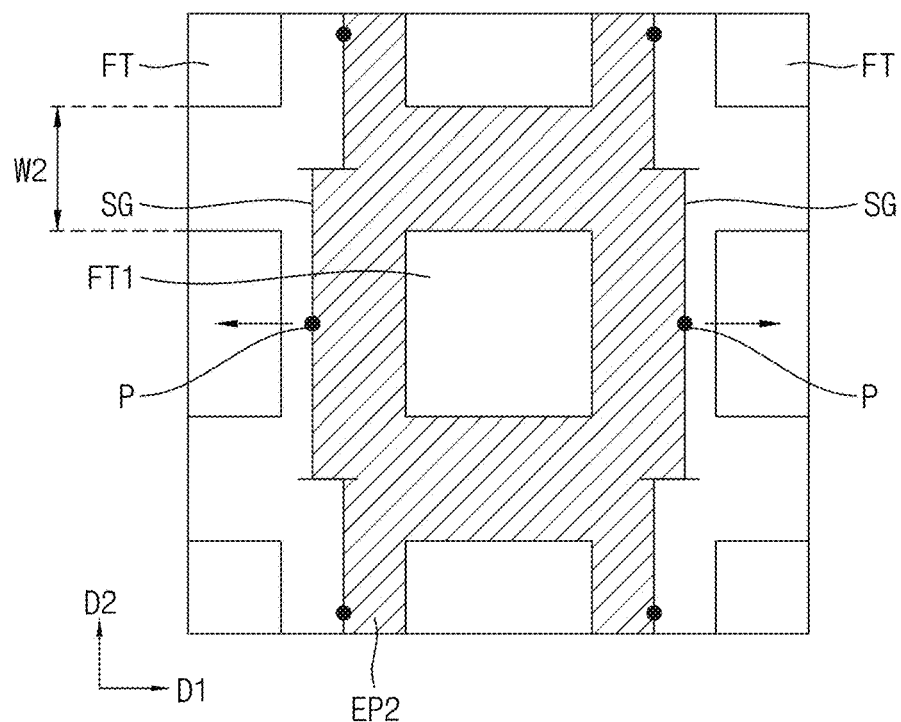

FIG. 32 is a conceptual view illustrating a method of fracturing and/or dissecting a second mask layout L2c on the basis of a corrected second target pattern TP2'c. FIG. 33 is a conceptual view illustrating a process (S140b) of correcting the second mask layout L2c.

Referring to FIGS. 32 and 33, a segment extension pattern EP2 of the second mask layout L2c may be fractured and/or dissected into a plurality of segments SG, and a target point P may be generated on each of the plurality of segments S along a second target pattern TP2'c. Each segment SG may be disposed based on a position of a final target FT. For example, a center point of a segment SG corresponding to a first final target FT1 among the plurality of segments SG may be aligned with a center point of the first final target FT1 in a first horizontal direction D1. In some example embodiments, an end point of each segment SG may be disposed at a center point between an edge of the first final target FT1 and an edge of a final target FT adjacent to the first final target FT1 in a second horizontal direction D2. For example, the first final target FT1 may be apart from the final target FT adjacent thereto by a certain width W2 in the second horizontal direction D2, and the end point of each segment SG may be disposed to halve the width W2. Additionally or alternatively, each segment SG may correspond to the protrusion patterns 310c and 312c illustrated in FIG. 31. The plurality of segments SG may be biased in a positive direction.

Figure 34:
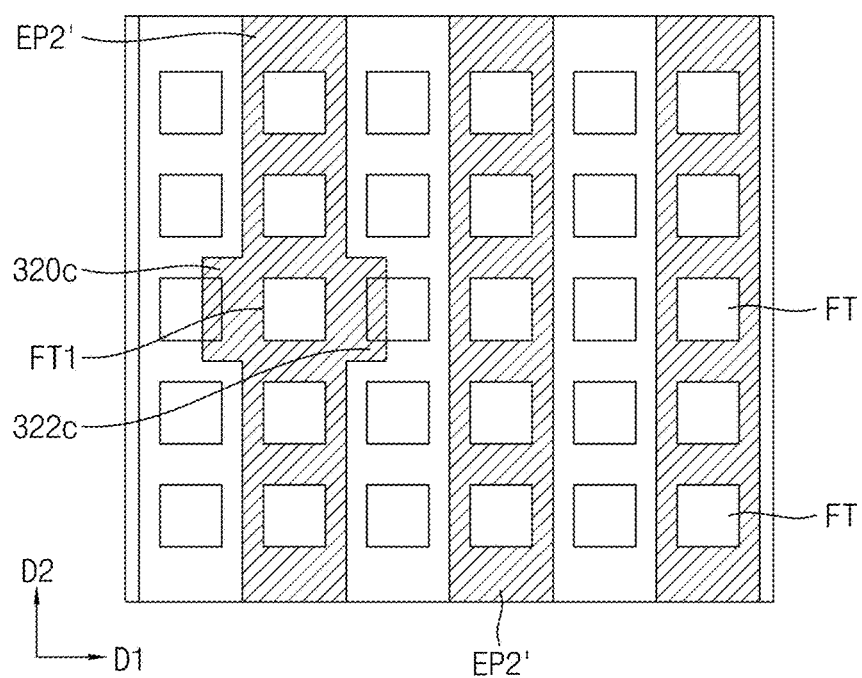

FIG. 34 illustrates a corrected second mask layout L2'c. The corrected second mask layout L2'c may include a plurality of second extension patterns EP2'. A corrected first extension pattern EP2' may include a protrusion pattern 320c to the left of a first final target FT1 and a protrusion pattern 322c to the right of the first final target FT1.

By fracturing and/or dissecting the first mask layout L1c and the second mask layout L2c as described in FIGS. 29 and 33, an error pattern may be more precisely adjusted. Additionally or alternatively, each segment SG may correspond to only one final target FT, and thus, a layout may be independently corrected on each final target FT.

Referring again to FIGS. 1 and 2, regarding to the process (S150) of forming the mask, the mask may be formed based on a designed mask layout. For example, a first photomask and a second photomask may be formed based on the first mask layout L1 and the second mask layout L2, which have been corrected in the processes (S140a) and (S140b). The first photomask may correspond to a layer which differs from the second photomask. Regarding to the process (S160) of forming the semiconductor device, a first photoresist pattern and a second photoresist pattern may be formed by using the first photomask and the second photomask. For example, after the first photoresist pattern is formed, a second photoresist and a hard mask covering the first photoresist pattern may be formed, and the second photoresist pattern may be formed by using the second photomask. A plurality of final patterns may be implemented by etching the hard mask by using each of the first photoresist pattern and the second photoresist pattern as an etch mask. The plurality of final patterns may be implemented as a semiconductor pattern in a target layer through an etching process, such as a dry etching and/or wet etching process.

Figure 35:
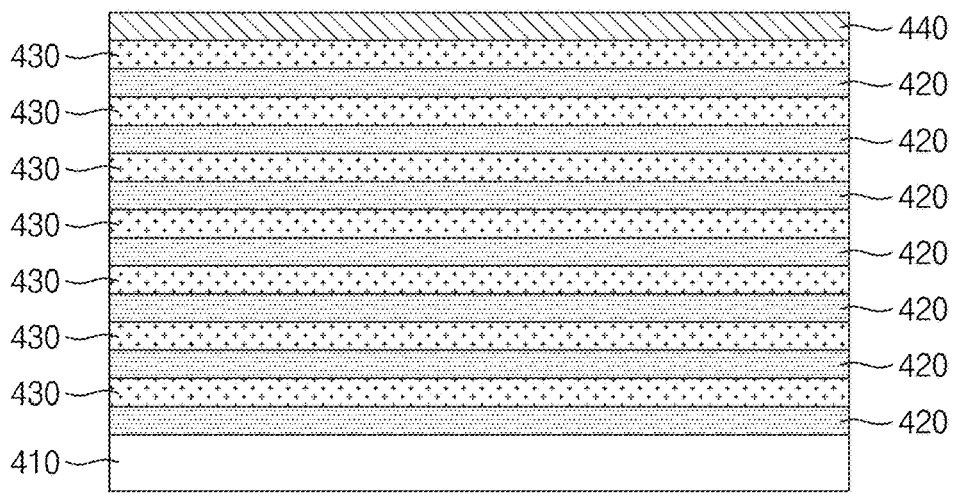
FIGS. 35 to 37 are cross-sectional views for describing a method of manufacturing a photomask, according to embodiments of inventive concepts.
Figure 36:
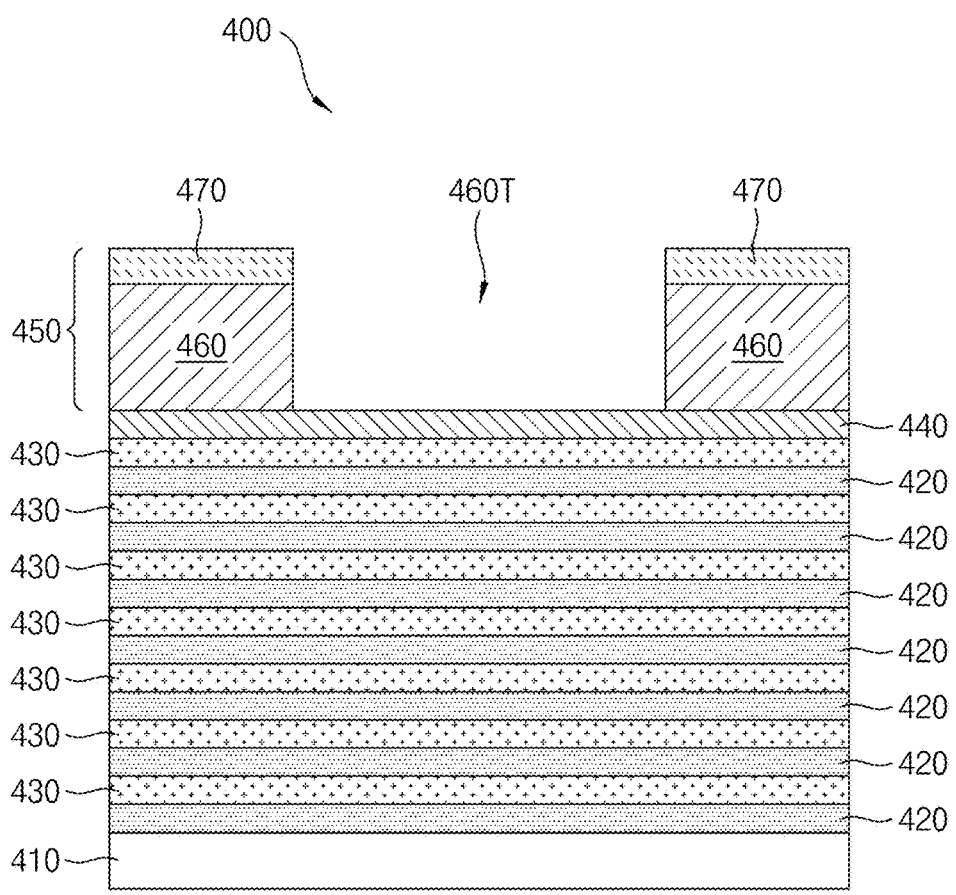
Figure 37:
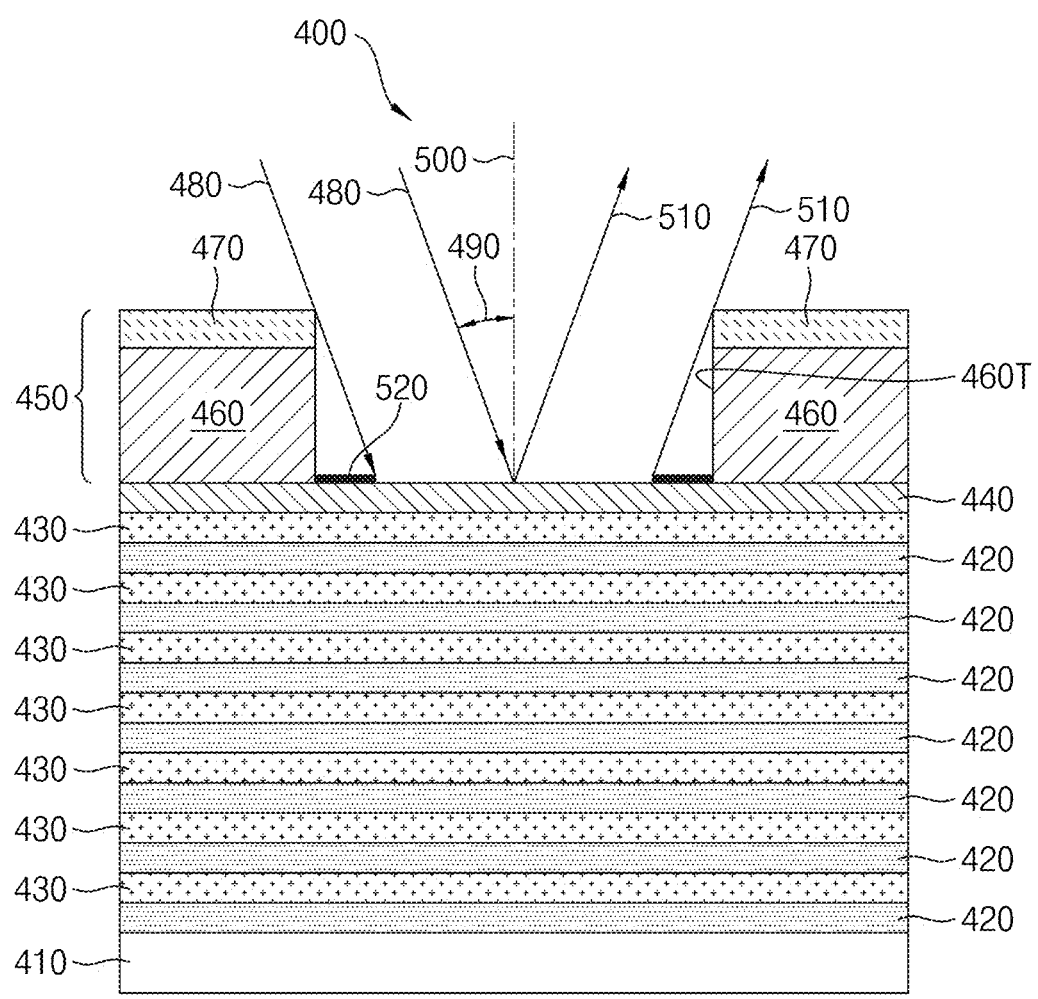

FIGS. 35 to 37 are cross-sectional views for describing a method of manufacturing a photomask, according to some example embodiments.

Referring to FIG. 35, the method of manufacturing the photomask according to some example embodiments of inventive concepts may include a process of forming a plurality of reflective layers 420 and 430 on a mask substrate 410 and forming a capping layer 440 on the plurality of reflective layers 420 and 430.

In some example embodiments, the photomask may be or correspond to an extreme ultraviolet (EUV) lithography mask. The mask substrate 410 may include a silicon layer such as an amorphous, poly, and/or single-crystal silicon layer. The plurality of reflective layers 420 and 430 may be or correspond to layers where a plurality of first material layers 420 and a plurality of second material layers 430 are alternately and repeatedly stacked. The plurality of reflective layers 420 and 430 may be stacked by interleaving the plurality of first material layers 420 and the plurality of second material layers 430. The plurality of second material layers 430 may include materials which differ from/not included among those of the plurality of first material layers 420. Each of the plurality of first material layers 420 may include a silicon layer and may not include molybdenum. Each of the plurality of second material layers 430 may include a molybdenum layer and may not include silicon. The capping layer 440 may include a ruthenium (Ru) layer.

Referring to FIG. 36, a mask pattern 450 may be formed on the capping layer 440. The photomask 400 may include the mask pattern 450, the capping layer 440, the plurality of reflective layers 420 and 430, and the mask substrate 410. The mask substrate 450 may be formed based on a first mask layout and a second mask layout described above with reference to FIGS. 1 to 34.

A process of forming the mask pattern 450 on the capping layer 440 may include a process of forming a thin layer with a process such as a chemical vapor deposition (CVD) process, along with a patterning process. The mask pattern 450 may include an absorbing agent 460, an anti-reflection layer 470, and an opening portion 460T. The absorbing agent 460 may directly contact the capping layer 440. The absorbing agent 460 may include tantalum boron nitride (TaBN). The anti-reflection layer 470 may cover the absorbing agent 460. The anti-reflection layer 470 may include lawrencium (Lr). The opening portion 460T may pass through the anti-reflection layer 470 and the absorbing agent 460 to expose a top surface of the capping layer 440.

Referring to FIG. 37, the photomask 400 may be or correspond to an EUV lithography mask.

In some example embodiments, in an EUV lithography system, light 480 (for example, an EUV radiation beam generated by a light source device) may be projected toward the photomask 400 at an inclined incident angle. The light 480 may be projected toward the photomask 400 on the basis of an inclined manner to form an incident angle 490 with respect to a vertical axis 500 vertical to a surface of the photomask 400. In some example embodiments, reflected light 510 may be projected toward a projection optical system (not shown) for performing an EUV lithography process, within a range where the incident angle 490 is about 5 degrees to about 7 degrees. Due to a height of the mask pattern 450, a shadow region 520 may occur in a surface of the mask pattern 400. The shadow region 520 may be reflected in the processes (S140a) and (S140b) of correcting the first mask layout and the second mask layout described above with reference to FIGS. 1 to 34.

In some example embodiments, the mask may be a light-transmitting mask. The mask substrate 410 may include a light-transmitting substrate such as quartz. The plurality of reflective layers 420 and 430 and the capping layer 440 may be omitted. The mask pattern 450 may include a light blocking layer such as a chromium (Cr) layer.

According to some example embodiments of inventive concepts, because a target pattern and a mask layout are corrected based on an error pattern, a CD of a final target may be precisely or more precisely adjusted, and a layout may be independently improved corrected on each final target.

Hereinabove, some example embodiments have been described with reference to the accompanying drawings, but it may be understood that those of ordinary skill in the art may implement the embodiments in another detailed form without changing the inventive concept or the essential feature. It should be understood that the embodiments described above are merely examples in all aspects and are not limited.

What is claimed is:

1. A method of manufacturing a mask, the method comprising:
    identifying an error pattern of final patterns corresponding to patterns on a substrate;
    correcting a first target pattern based on the error pattern, the first target pattern corresponding to a pattern of intersection of two photoresist patterns on a substrate;
    fracturing a first mask layout into a plurality of first segments based on the corrected first target pattern, the first mask layout including (a) a first extension pattern extending in a first horizontal direction, (b) final targets corresponding to the final patterns and arranged in a zigzag fashion, and (c) a first final target corresponding to the error pattern, each of the plurality of first segments corresponding to one of the final targets; and
    correcting the first mask layout by biasing a plurality of first target segments corresponding to the first final target among the plurality of first segments.

2. The method of claim 1, wherein an end point of each of the plurality of first target segments is between an edge of the first final target and an edge of a second final target, the second final target adjacent to the first final target in a second horizontal direction, the second horizontal direction intersecting the first horizontal direction.

3. The method of claim 2, wherein an end point of each of the plurality of first target segments is at a center point of a portion of the first final target, the portion overlapping the adjacent second final target in the second horizontal direction.

4. The method of claim 1, wherein each of the final targets corresponds to two first segments.

5. The method of claim 1, wherein, in response to the first final target overlapping the first extension pattern and a critical dimension of the error pattern being less than a critical dimension of the first final target, the correcting of the first mask layout includes biasing the plurality of first target segments in a positive direction.

6. The method of claim 1, wherein in response to the first final target overlapping the first extension pattern and a critical dimension of the error pattern being misaligned, the correcting of the first mask layout includes biasing the plurality of first target segments in a direction opposite to a misaligned direction.

7. The method of claim 1, wherein in response to the first final target not overlapping the first extension pattern and a critical dimension of the error pattern is relatively less than a critical dimension of the first final target, the correcting of the first mask layout includes biasing the plurality of first target segments in a negative direction.

8. The method of claim 1, wherein the correcting of the first target pattern comprises:
   forming a marker layer overlapping the first final target;
   selecting a first error region from the marker layer;
   correcting the first error region from the marker layer; and
   reflecting the corrected first error region in the first target pattern.

9. The method of claim 1, wherein the correcting the first mask layout comprises:
   generating a target point along the first target pattern; and
   biasing the first target segment so that a simulation contour of the first mask layout matches the target point.

10. The method of claim 1, wherein each of the final targets has one of a quadrilateral shape, a circular shape, or an oval shape.

11. The method of claim 1, further comprising:
   correcting a second target pattern based on the error pattern;
   fracturing a second mask layout into a plurality of second segments based on the corrected second target pattern, the second mask layout including (a) a second extension pattern extending in a direction intersecting with the first horizontal direction, (b) final targets corresponding to the final patterns, and (c) a first final target corresponding to the error pattern, each of the plurality of second segments corresponding to one of the final targets; and
   correcting the second mask layout by biasing a plurality of second target segments corresponding to the first final target among the plurality of second segments.

12. The method of claim 11, wherein the second extension pattern is arranged in a diagonal direction with respect to the first horizontal direction.

13. The method of claim 12, further comprising, before the correcting of the second target pattern:
   rotating the second target pattern so that the final targets and edges of the second extension pattern are parallel to the first horizontal direction,
   wherein the correcting of the second mask layout includes biasing the plurality of second target segments in the first horizontal direction.

14. A method of manufacturing a mask, the method comprising:
   identifying an error pattern of final patterns corresponding to patterns on a substrate;
   correcting a first target pattern based on the error pattern, the first target pattern corresponding to a pattern of intersection of two photoresist patterns on a substrate;
   fracturing a first mask layout into a plurality of first segments based on the corrected first target pattern, the first mask layout including (A) a first extension pattern extending in a first horizontal direction, (B) final targets corresponding to the final patterns, and (C) a first final target in a lattice structure, the first final target corresponding to the error pattern, each of the plurality of first segments corresponding to one of the final targets; and
   correcting the first mask layout by biasing a plurality of first target segments corresponding to the first final target among the plurality of first segments.

15. The method of claim 14, wherein an end point of each of the plurality of first target segments is between an edge of the first final target and an edge of a final target adjacent to the first final target in the first horizontal direction.

16. The method of claim 15, wherein an end point of each of the plurality of first target segments is at a center point between an edge of the first final target and an edge of the adjacent final target.

17. The method of claim 14, further comprising:
   correcting a second target pattern based on the error pattern;
   fracturing a second mask layout into a plurality of second segments based on the corrected second target pattern, the second mask layout including (A) a second extension pattern extending in a second horizontal direction, the second horizontal direction perpendicular to the first horizontal direction, (B) final targets corresponding to the final patterns, and (C) a first final target corresponding to the error pattern, each of the plurality of second segments corresponding to one of the final targets; and
   correcting the second mask layout by biasing a plurality of second target segments corresponding to the first final target among the plurality of second segments.

18. A method of manufacturing a semiconductor device, the method comprising:
   identifying an error pattern of final patterns corresponding to patterns on a substrate;
   correcting a first target pattern based on the error pattern, the first target pattern corresponding to a pattern of intersection of two photoresist patterns on a substrate;
   fracturing a first mask layout into a plurality of first segments based on the corrected first target pattern, the first mask layout including (A) a first extension pattern extending in a first horizontal direction, (B) final targets corresponding to the final patterns, and (C) a first final target disposed in zigzags to correspond to the error pattern, each of the plurality of first segments corresponds to one of the final targets;
   correcting the first mask layout by biasing a plurality of first target segments corresponding to the first final target among the plurality of first segments;
   forming a photomask based on the corrected first mask layout;
   forming a photoresist pattern by using the photomask; and
   forming a semiconductor pattern on the substrate by using the photoresist pattern.

19. The method of claim 18, wherein
   the forming of the photoresist pattern includes performing a lithography process, and
   the lithography process includes an extreme ultraviolet (EUV) lithography process.

20. The method of claim 19, wherein
   the forming of the photomask includes sequentially forming a mask substrate, a reflective layer, and a capping layer,
   the reflective layer includes a plurality of first material layers and a plurality of second material layers which are alternately stacked,
   the mask substrate includes quartz,
   each of the plurality of first material layers includes a silicon layer,
   each of the plurality of second material layers includes a molybdenum layer, and
   the capping layer includes a ruthenium layer.

* * * * *